(12) United States Patent
Li et al.

(10) Patent No.: US 11,917,857 B2
(45) Date of Patent: Feb. 27, 2024

(54) DISPLAY MODULE AND DISPLAY DEVICE

(71) Applicant: Wuhan Tianma Micro-Electronics Co., Ltd., Wuhan (CN)

(72) Inventors: Shengming Li, Wuhan (CN); Jiang Chen, Wuhan (CN); Jun Huang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 231 days.

(21) Appl. No.: 17/469,743

(22) Filed: Sep. 8, 2021

(65) Prior Publication Data
US 2022/0310979 A1    Sep. 29, 2022

(30) Foreign Application Priority Data

Mar. 26, 2021  (CN) .......................... 202110328299.3

(51) Int. Cl.
| | | |
|---|---|---|
| *H01L 51/52* | (2006.01) | |
| *H10K 50/80* | (2023.01) | |
| *H10K 50/86* | (2023.01) | |
| *H10K 102/10* | (2023.01) | |

(52) U.S. Cl.
CPC ......... *H10K 50/865* (2023.02); *H10K 50/868* (2023.02); *H10K 2102/102* (2023.02); *H10K 2102/103* (2023.02)

(58) Field of Classification Search
CPC ............... H10K 50/865; H10K 50/868; H10K 2102/102; H10K 2102/103; H10K 50/841; H10K 59/131; H10K 59/126; H10K 59/123; H10K 59/1315; H10K 59/40

See application file for complete search history.

(56) References Cited

U.S. PATENT DOCUMENTS

| | | | | |
|---|---|---|---|---|
| 2001/0001050 | A1* | 5/2001 | Miyashita | ............... H10K 59/35 |
| | | | | 428/690 |
| 2022/0068169 | A1* | 3/2022 | Yohn | .................. H10K 59/1213 |

FOREIGN PATENT DOCUMENTS

| | | |
|---|---|---|
| CN | 202976029 U | 6/2013 |
| CN | 105808012 A | 7/2016 |
| KR | 20220029162 A  * | 3/2022 ............. H01L 51/52 |

OTHER PUBLICATIONS

English Machine Translation of KR 10-2022-0029162 (Year: 2023).*

* cited by examiner

*Primary Examiner* — Donald L Raleigh
(74) *Attorney, Agent, or Firm* — Alston & Bird LLP

(57) ABSTRACT

Provided are a display module and display device. The display module includes a display panel, a cover plate and a conductive shielding layer. The conductive shielding layer is located on a side of the display panel, and the cover plate is located on a side of the display panel facing away from the conductive shielding layer. The display module includes a conductive film. The conductive film is located on a side of the cover plate facing the conductive shielding layer, and the conductive film is connected to the cover plate and the conductive shielding layer separately.

20 Claims, 14 Drawing Sheets

DISPLAY MODULE AND DISPLAY DEVICE

CROSS-REFERENCE TO RELATED APPLICATION

This application claims priority to Chinese Patent Application No. 202110328299.3 filed with the CNIPA Mar. 26, 2021, the disclosure of which is incorporated herein by reference in its entirety.

TECHNICAL FIELD

The present disclosure relates to the field of display technologies and, in particular, to a display module and a display device.

BACKGROUND

Devices are widely available and have become an essential tool in people's daily lives and work. The display device performs the image display through the display module.

The existing display module includes a display panel and a protective cover plate. During use or testing, a large amount of charges is generated on the protective cover plate. For example, the surface of the protective cover plate is usually provided with an anti-fingerprint layer. A main functional component of the anti-fingerprint layer for anti-fingerprint is fluorine (F) atoms. When the display module is used, after the protective cover plate is rubbed by fingers, F atoms are easy to get electrons, resulting in that a large amount of negative charges are generated on the surface of the protective cover plate after being rubbed by the fingers. During the test of the display module, the protective cover is rubbed by a copper bar to test a touch function, a large amount of charges (containing both positive and negative charges) are also generated in this process, the generated large amount of charges form an accumulation of static electricity, and the static electricity is conducted to the display panel, which has a negative effect on the display panel, causing the display panel to display green shift or display in a four-split screen (different brightness at different positions of the screen).

SUMMARY

The present disclosure provides a display module and a display device to reduce the effect of static electricity on a display panel.

In a first aspect, the present disclosure provides a display module. The display module includes a display panel, a cover plate and a conductive shielding layer.

The conductive shielding layer is located on a side of the display panel, and the cover plate is located on a side of the display panel facing away from the conductive shielding layer.

The display module further includes a conductive film, where the conductive film is located on a side of the cover plate facing the conductive shielding layer, and the conductive film is connected to the cover plate and the conductive shielding layer separately.

In a second aspect, the present disclosure provides a display device. The display device includes the display module described in the first aspect.

DETAILED DESCRIPTION

Figure 1:
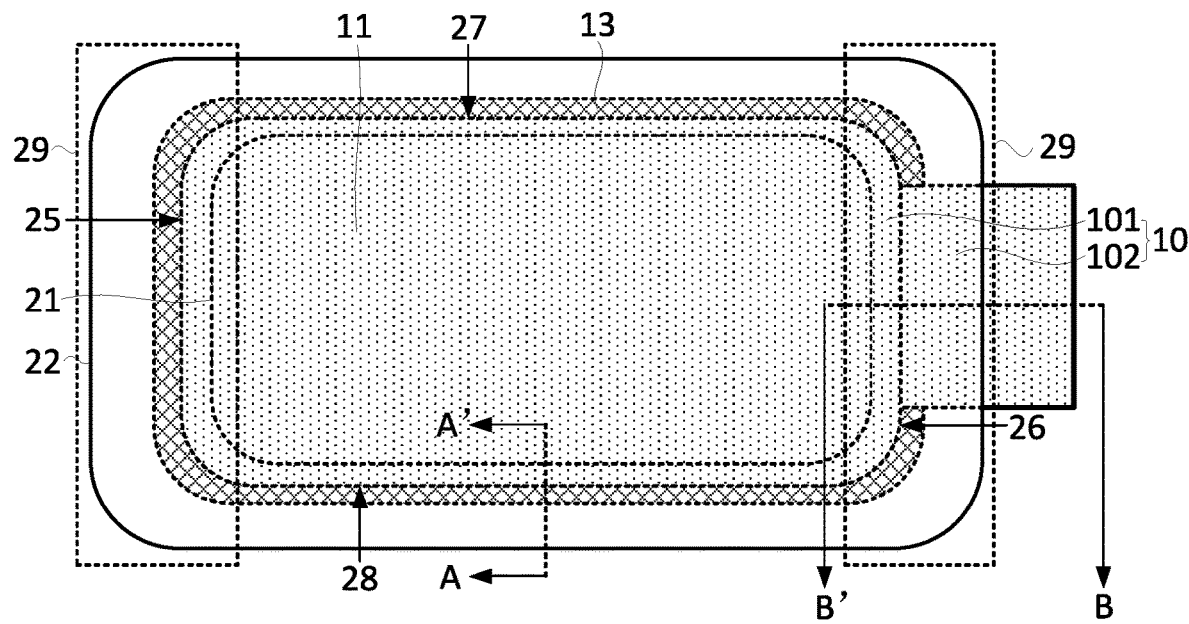
FIG. 1 is a structure diagram of a display module provided by an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Figure 2:
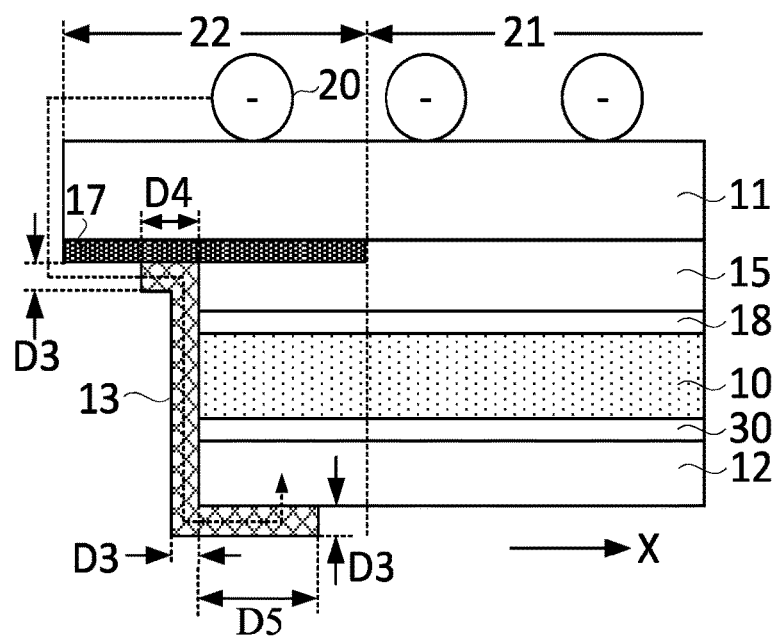
FIG. 2 is a sectional diagram of FIG. 1 taken along a A-A' direction.

FIG. 1 is a structure diagram of a display module provided by an embodiment of the present disclosure. FIG. 2 is a sectional diagram of FIG. 1 taken along a A-A' direction. As shown in FIGS. 1 and 2, the display module provided by the embodiment of the present disclosure includes a display panel 10, a cover plate 11 and a conductive shielding layer 12. The conductive shielding layer 12 is located on a side of the display panel 10, and the cover plate 11 is located on a side of the display panel 10 facing away from the conductive shielding layer 12. The display module also includes a conductive film 13. The conductive film 13 is located on a side of the cover plate 11 facing the conductive shielding layer 12, and the conductive film 13 is connected to the cover plate 11 and the conductive shielding layer 12 separately.

As shown in FIGS. 1 and 2, the display panel 10 is used for displaying. The display panel 10 may be a flexible organic light emitting diode (OLED) display panel or a rigid OLED display panel, which can be set by those skilled in the art according to actual requirements.

Referring to FIGS. 1 and 2, the side of the display panel 10 is provided with the cover plate 11. The cover plate 11 is used for protecting the display panel 10. The cover plate may be a glass cover plate or made of another transparent material, which is not limited in the embodiment of the present disclosure.

Referring to FIGS. 1 and 2, the side of the display panel 10 facing away from the cover plate 11 is provided with the conductive shielding layer 12 used for conducting heat, conducting static electricity and shielding signals, thereby ensuring the reliability of the display module. The conductive shielding layer 12 may be made of a copper foil or another metal material. For example, the conductive shielding layer 12 may be made of a super composite film (SCF), which is composed of a foam, a polyimide (PI) and a copper foil and plays a good role in heat dissipation and protection, and those skilled in the art can set the conductive shielding layer 12 according to the actual requirements.

Referring to FIGS. 1 and 2, the side of the cover plate 11 facing the conductive shielding layer 12 is also provided with the conductive film 13, and the conductive film 13 is connected to the cover plate 11 and the conductive shielding layer 12 separately. The conductive film 13 is used for conducting charges 20 generated on the cover plate 11 to the conductive shielding layer 12, that is, the charges 20 are discharged sequentially through the conductive film 13 and the conductive shielding layer 12, preventing a large amount of charges from forming an accumulation of static electricity, thereby reducing the effect of static electricity on the display panel 10.

It is to be noted that conductive film 13 may be connected to the cover plate 11 through a direct contact, or alternatively through another conductive media, as long as the static electricity on the cover plate 11 can be conducted to the conductive film 13. Those skilled in the art can set the connection mode between the conductive film 13 and the cover plate 11 according to the actual requirements.

In the display module provided by the embodiment of the present disclosure, the conductive film 13 is disposed on the side of the cover plate 11 facing the conductive shielding layer 12 and is connected to the cover plate 11 and the conductive shielding layer 12 separately, so that the charges 20 generated on the cover plate 11 are conducted to the conductive shielding layer 12 through the conductive film 13 so as to discharge the static electricity, thereby reducing the effect of the static electricity on the display panel 10 and improving the reliability of the display module.

Figure 3:
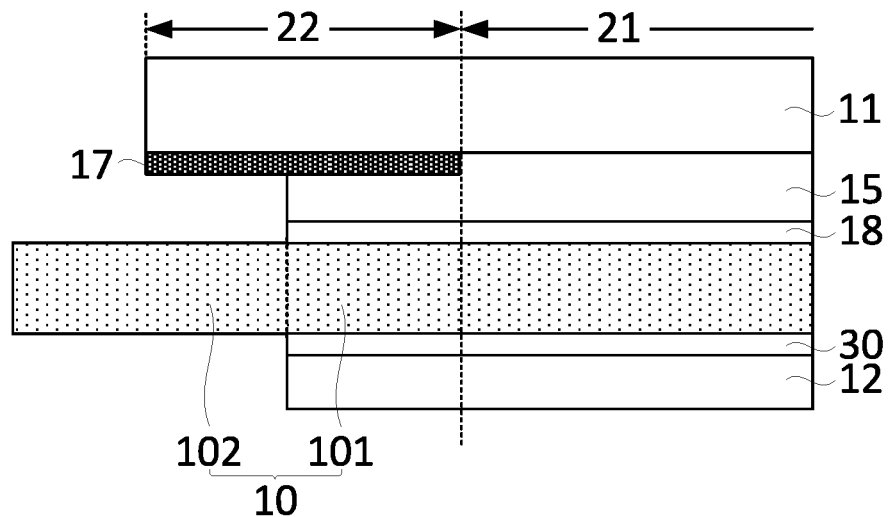
FIG. 3 is a sectional diagram of FIG. 1 taken along a B-B' direction.

FIG. 3 is a sectional diagram of FIG. 1 taken along a B-B' direction. As shown in FIGS. 1 to 3, the display module provided by the embodiment of the present disclosure may further include a display area 21 and a non-display area 22 disposed around the display area 21. The conductive film 13 is located in the non-display area 22. The display panel 10 includes a main body 101 and a rear folded portion 102, and the conductive film 13 and the rear folded portion 102 do not overlap in a direction perpendicular to a plane where the cover plate 11 is located.

Specifically, as shown in FIGS. 1 to 3, the display area 21 of the display module may emit light by configuring multiple sub-pixels arranged in an array to implement the image display. The non-display area 22 disposed around the display area 21 is configured to provide a driving circuit such as a shift register. The non-display area 22 may also be configured to provide a driver chip to drive the sub-pixels of the display area 21, or to provide a connection trace to connect the sub-pixels of the display area 21 to the driver chip. In this embodiment, the conductive film 13 is disposed in the non-display area 22, so that the effect of the conductive film 13 on the display of the display module can be avoided.

Referring to FIGS. 1 to 3, the display panel 10 includes the main body 101 and the rear folded portion 102. The rear folded portion 102 may be used for binding a flexible printed circuit (FPC) or a driver chip (IC). Specifically, the rear folded portion 102 is provided with the connection trace to connect the sub-pixels of the display area 21 to the flexible printed circuit or the driver chip. The rear folded portion 102 may be bent toward the side of the display panel 10 facing away from the cover plate 11, so that the flexible circuit board or the driver chip is bent to the side of the display panel 10 facing away from the cover plate 11, thereby reducing the width of the bezel and improving the visual effect of the display module.

Referring to FIGS. 1 to 3, since the rear folded portion 102 is provided with the connection trace, the conductive film 13 is configured not to overlap the rear folded portion 102 in the direction perpendicular to the plane where the cover plate 11 is located, that is, the conductive film 13 is not provided in the area where the rear folded portion 102 is located in a thickness direction of the cover plate 11, and the conductive film 13 is merely located in the area where the rear folded portion 102 is not provided in the display module, thereby preventing the conductive film 13 from being in contact with the connection trace on the rear folded portion 102 and causing a short circuit which affects the display of the display panel 10.

It is to be noted that in the present disclosure, the non-overlapping or the at least partially overlapping between different structures refers to that the different structures do not overlap or at least partially overlap in a direction perpendicular to the plane where the cover plate 11 is located, which will not be described in the subsequent embodiments.

It is to be noted that the driver chip (IC) may adopt various encapsulation technologies to reduce the width of the bezel and increase the screen-to-body ratio of the display module, which is not limited in the embodiment of the present disclosure.

Taking the display panel 10 being a flexible OLED display panel as an example, the driver chip (IC) may adopt a chip on PI (COP) technology, that is, the driver chip is directly disposed on the rear folded portion 102 of the display panel 10, and the rear folded portion 102 is bent to the side of the display panel 10 facing away from the cover plate 11, thereby reducing the width of the bezel and increasing the screen-to-body ratio of the display module.

In other embodiments, the driver chip (IC) may also adopt a chip on flex or chip on film (COF) encapsulation technology in which a flexible printed circuit (FPC) is configured to be connected to the display panel 10 and the driver chip (IC) is disposed on the flexible printed circuit, that is, the driver chip (IC) is connected to the sub-pixels of the display panel 10 through the flexible printed circuit. In this case, the flexible printed circuit serves as the rear folded portion 102 of the display panel 10, and the flexible printed circuit is bent to the side of the display panel 10 facing away from the cover plate 11, thereby reducing the width of the bezel and increasing the screen-to-body ratio of the display module.

It is to be noted that FIGS. 1 to 3 merely show a structure of the display panel 10 in a case where the rear folded portion 102 is not bent. After the driver chip (IC) is encapsulated, the rear folded portion 102 is bent to the side of the display panel 10 facing away from the cover plate 11.

Figure 4:
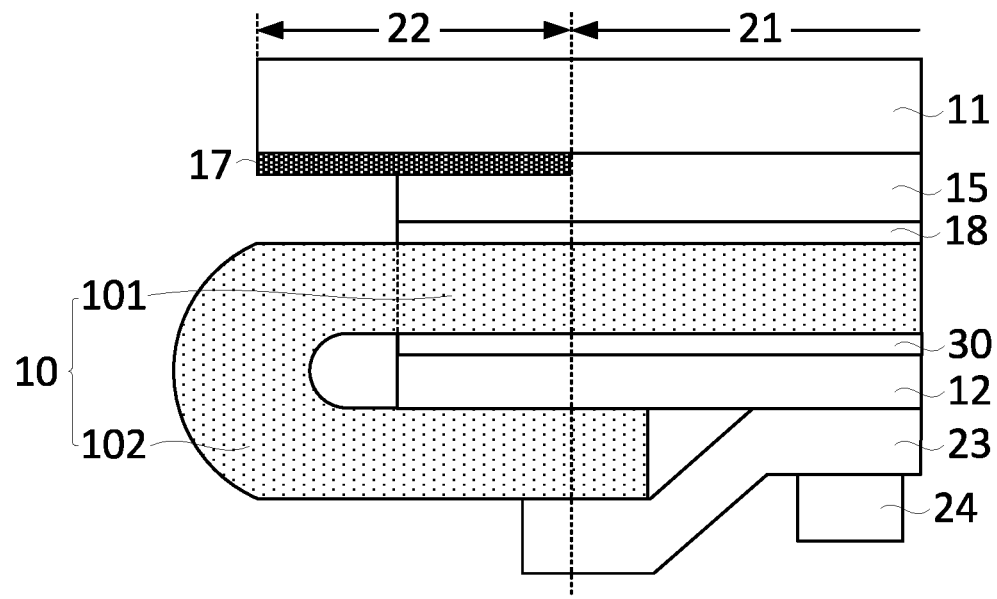
FIG. 4 is a partial sectional diagram of a display module provided by an embodiment of the present disclosure.

As an example, FIG. 4 is a partial sectional diagram of a display module provided by an embodiment of the present disclosure. As shown in FIG. 4, for example, a driver chip 24 is connected to a rear folded portion 102 of a display panel 10 through a flexible printed circuit 23. The rear folded portion 102 is bent to a side of the display panel 10 facing away from a cover plate 11 so that the flexible printed circuit 23 and the driver chip 24 are disposed on the side of the display panel 10 facing away from the cover plate 11, thereby reducing the width of the bezel and increasing the screen-to-body ratio of the display module. The rear folded portion 102 and/or the flexible printed circuit board 23 may be electrically connected to the conductive shielding layer 12 to discharge the static electricity on the rear folded portion 102 and/or the flexible printed circuit 23, thereby further reducing the effect of the static electricity on the display module.

Referring to FIG. 1, a conductive film 13 may be located on at least one side of a display area 21.

The conductive film 13 may be located on one side, two sides, three sides or four sides of the display area 21. In practical configuration, the conductive film 13 has various specific design schemes. A typical example is described below in detail, which is not intended to limit the present disclosure.

As shown in FIG. 1, a case where the conductive film 13 is located on four sides of the display area 21 is taken as an example, and the conductive film 13 is disposed around the display area 21 to increase an overlapping area of the conductive film 13 and the cover plate 11. The overlapping area of the conductive film 13 and the cover plate 11 refers to a projection area of the conductive film 13 on the plane where the cover plate 11 is located in a direction perpendicular to the plane where the cover plate 11 is located. That is, in the direction perpendicular to the plane where the cover plate 11 is located, the projection area of the conductive film 13 on the plane where the cover plate 11 is located is increased, implementing omnidirectional charge discharging of the cover plate 11, thereby rapidly conducting the static electricity on the cover plate 11 to the conductive shielding layer 12, increasing the dissipation speed of the static electricity, and further reducing the effect of the static electricity on the display panel 10.

As shown in FIG. 1, the display panel 10 includes a first boundary 25 and a second boundary 26 disposed opposite to each other, and a third boundary 27 and a fourth boundary 28 disposed opposite to each other. The conductive film 13 is disposed on a side of each of the first boundary 25, the second boundary 26, the third boundary 27, and the fourth boundary 28 facing away from the display region 21 so as to increase the overlapping area of the conductive film 13 and the cover plate 11, thereby rapidly conducting the static electricity on the cover plate 11 to the conductive shielding layer 12, increasing the dissipation speed of the static electricity, and further reducing the effect of the static electricity on the display panel 10.

Figure 5:
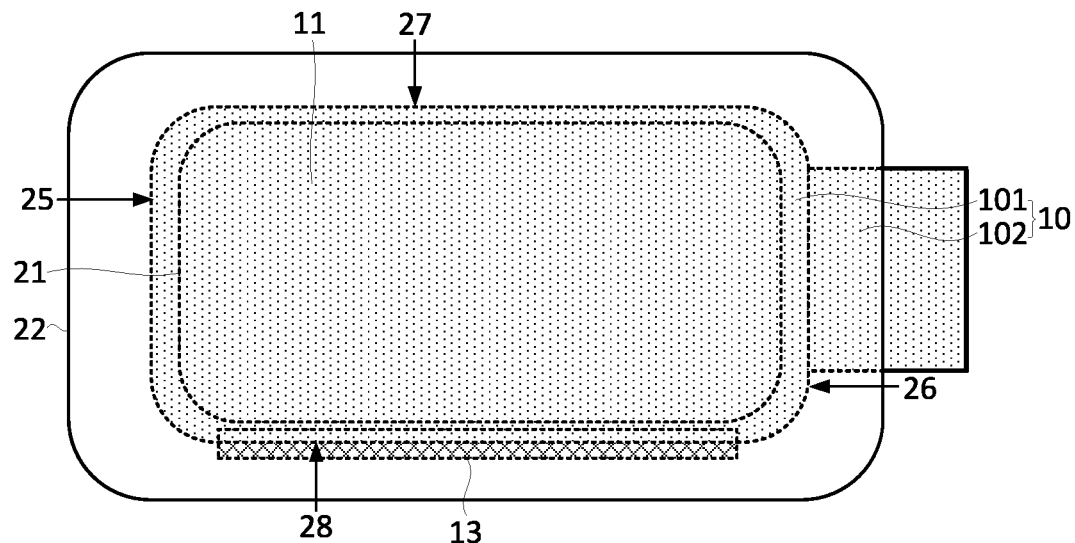
FIG. 5 is a structure diagram of another display module provided by an embodiment of the present disclosure.

FIG. 5 is a structure diagram of another display module provided by an embodiment of the present disclosure. As shown in FIG. 5, the case where a conductive film 13 is located on a side of a display area 21 is taken as an example. A display panel 10 includes a first boundary 25 and a second boundary 26 disposed opposite to each other, and a third boundary 27 and a fourth boundary 28 disposed opposite to each other. The conductive film 13 is disposed merely on a side of the first boundary 25, the second boundary 26, the third boundary 27, or the fourth boundary 28 facing away from the display area 21 (FIG. 5 illustrates an example in which the conductive film 13 is disposed merely on a side of the fourth boundary 28 facing away from the display area 21) to reduce the space occupied by the conductive film 13, thereby reducing the effect of the conductive film 13 on the complete machine assembly space.

Figure 6:
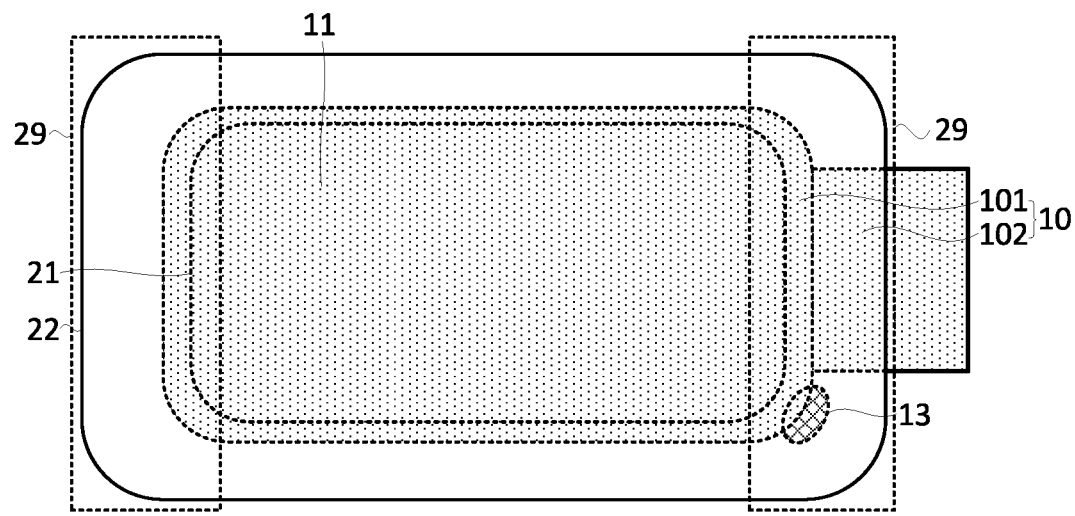
FIG. 6 is a structure diagram of another display module provided by an embodiment of the present disclosure.

Furthermore, FIG. 6 is a structure diagram of another display module provided by an embodiment of the present disclosure. As shown in FIG. 6, the conductive film 13 is merely disposed in a local area to further reduce the space occupied by the conductive film 13, thereby further reducing the effect of the conductive film 13 on the complete machine assembly space.

It is to be noted that the overlapping area of the conductive film 13 and the cover plate 11 can be adjusted according to the whole machine requirements or the antistatic capability of the module, and a position of the conductive film 13 can also be set according to actual requirements, which is not limited in the embodiment of the present disclosure.

Referring to FIGS. 1 and 6, the display module provided in the embodiment of the present disclosure may further include a special-shaped area 29, and the conductive film 13 at least partially overlaps the special-shaped area 29 in the direction perpendicular to the plane where the cover plate 11 is located.

As shown in FIGS. 1 and 6, the special-shaped area 29 is an area whose shape is not a regular rectangle, and the special-shaped area may be formed by a special-shaped cutting manner (cutting a regular rectangle into an irregular special-shaped pattern). As shown in FIGS. 1 and 6, a chamfered structure is cut at each of four vertex angles of the display module 10 in a regular rectangle shape to enhance the strength of the display module. The chamfered structure may include a rounded corner (R corner). A radian of the R corner may be configured according to the actual requirements. In other embodiments, the chamfered structure may also include a right-angled corner (C corner), an angle of the C corner may be configured according to the actual requirements, which is not limited in the embodiment of the present disclosure.

It is to be noted that, the display module shown in FIGS. 1 and 6 merely show examples in which the chamfered structure is disposed at the four vertex angles of the display module 10. In other embodiments, a notch structure may also be cut on a side of the display module to place a front-facing camera, a distance sensor, a sound sensor or another element known to those skilled in the art. The notch structure may include a V-shaped groove, a U-shaped groove or another notch structure known to those skilled in the art, which is not limited in the embodiment of the present disclosure.

For some display panels 10, such as a rigid OLED display panel, the display panel 10 is more likely to be damaged by the static electricity in the special-shaped area 29. Therefore, in this embodiment, the conductive film 13 is configured to at least partially overlap the special-shaped area 29 in the direction perpendicular to the plane where the cover plate 11 is located, so that the static electricity in the special-shaped area 29 is rapidly conducted to the conductive shielding layer 12, thus increasing the dissipation speed of the static electricity in the special-shaped area 29, and thereby preventing the display panel 10 from being damaged by the static electricity in the special-shaped area 29.

That the conductive film 13 at least partially overlaps the special-shaped area 29 includes that the conductive film 13 partially overlaps the special-shaped area 29 (as shown in FIG. 1) and that the conductive film 13 is located in the special-shaped area 29 (as shown in FIG. 6), which can be set by those skilled in the art according to the actual requirements, and is not limited in the embodiment of the present disclosure.

The conductive film 13 may include silver paste.

The silver paste is a sticky paste of a mechanical mixture composed of high-purity (e.g., 99.9%) metallic silver particles, an adhesive, a solvent and an additive. The silver paste has characteristics of low curing temperature, extremely high bonding strength, stable electrical performance and the like, so that the conductive film 13 can be effectively and reliably connected to the cover plate 11 and the conductive shielding layer 12.

Moreover, since the silver paste has a relatively small resistivity, which helps to reduce the overlapping area of the conductive film 13 and the cover plate 11 to reduce the space occupied by the conductive film 13, thereby reducing the effect of the conductive film 13 on the complete machine assembly space.

In addition, the silver paste may be liquid in a normal temperature environment, and by manual dispensing, the conductive film 13 can be formed by dropping the silver paste at a position where the electrical connection is required, which is simple and easy to implement.

As an example, referring to FIG. 6, the conductive film 13 is locally formed by dispensing the silver paste in the special-shaped area 29 of the display panel 10, reducing the space occupied by the conductive film 13 while ensuring the conductive film 13 to conduct the static electricity effectively and reliably, thereby reducing the effect of the conductive film 13 on the complete machine assembly space.

The conductive film 13 may include a fluorinating agent and conductive particles. The conductive particles include one or more of carbon powder, copper powder, aluminum powder and iron powder.

The fluorinating agent may form a film with a relatively thin thickness, thereby reducing the thickness of the conductive film 13, reducing the space occupied by the conductive film 13, and reducing the effect of the conductive film 13 on the design of the structure (the cooperation of the module with the complete machine). It is to be noted that, in other embodiments, other liquid formulations may be adopted by those skilled in the art to form the conductive film 13, which is not limited by the embodiment of the present disclosure.

Furthermore, conductive particles are provided in the fluorinating agent to reduce the resistivity of the conductive film 13, so that the static electricity on the cover plate 11 is more easily conducted to the conductive shielding layer 12, reducing the probability of conducting the static electricity to the display panel 10, thereby reducing the effect of the static electricity on the display panel 10.

The conductive particles may include one or more of the carbon powder, the copper powder, the aluminum powder and the iron powder. The carbon powder, the copper powder, the aluminum powder, and the iron powder all have a good conductivity, thereby reducing the resistivity of the conductive film 13. Those skilled in the art can select the conductive particles according to the actual requirements. For example, the conductive particles adopt the carbon powder which has good stability and is not easy to be oxidized, and thus the reliability of the conductive film 13 is improved.

In an example embodiment, a resistance value R1 of the fluorinating agent is configured to satisfy $R1 \leq 10^6 \Omega$ to ensure the conductivity of the fluorinating agent, so that the static electricity on the cover plate 11 is more easily conducted to the conductive shielding layer 12, reducing the probability of conducting the static electricity to the display panel 10, thereby reducing the effect of the static electricity on the display panel 10.

Figure 7:
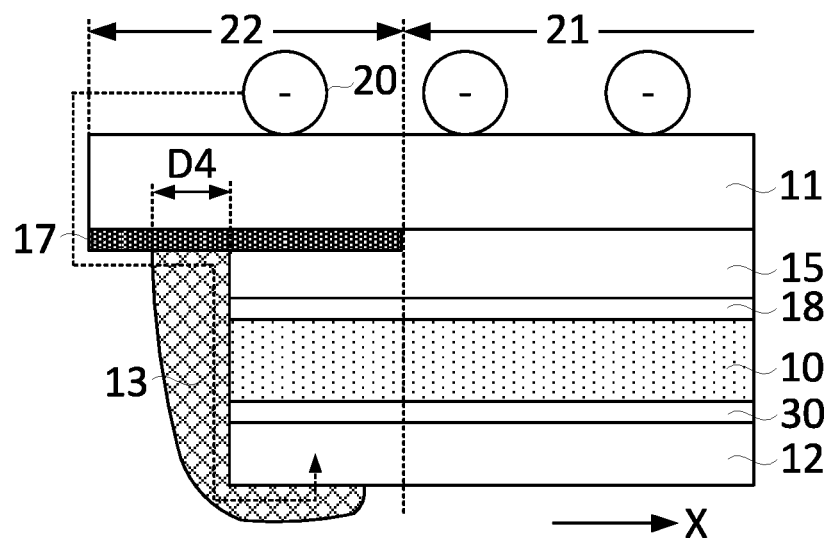
FIG. 7 is a partial sectional diagram of another display module provided by an embodiment of the present disclosure.

It is to be noted that, a sectional shape of the conductive film 13 is determined by a material of the conductive film 13 and a preparation process of the conductive film 13. For example, FIG. 7 is a partial sectional diagram of another display module provided by an embodiment of the present disclosure. As shown in FIG. 7, for example, the conductive film 13 includes the silver paste, and the sectional shape of the conductive film 13 formed by dispensing the silver paste is irregular. Referring to FIG. 2, for example, the conductive film 13 includes the fluorinating agent and the conductive particles, and the sectional shape of the formed conductive film 13 is a relatively thin film. Therefore, the sectional shape of the conductive film 13 is not limited in the embodiment of the present disclosure.

Figure 8:
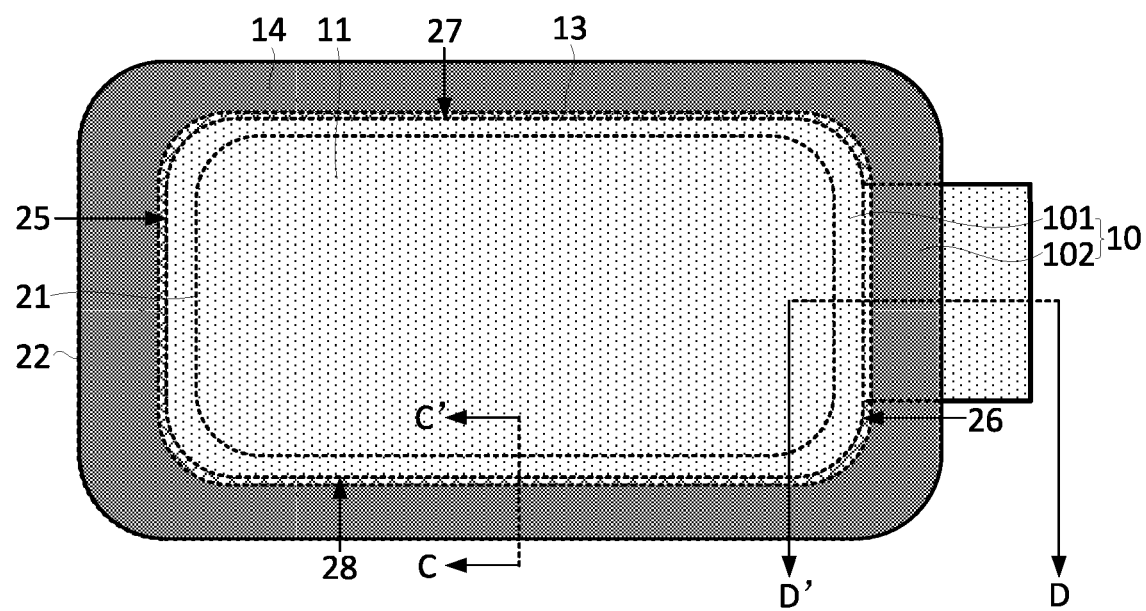
FIG. 8 is a structure diagram of another display module provided by an embodiment of the present disclosure.
Figure 9:
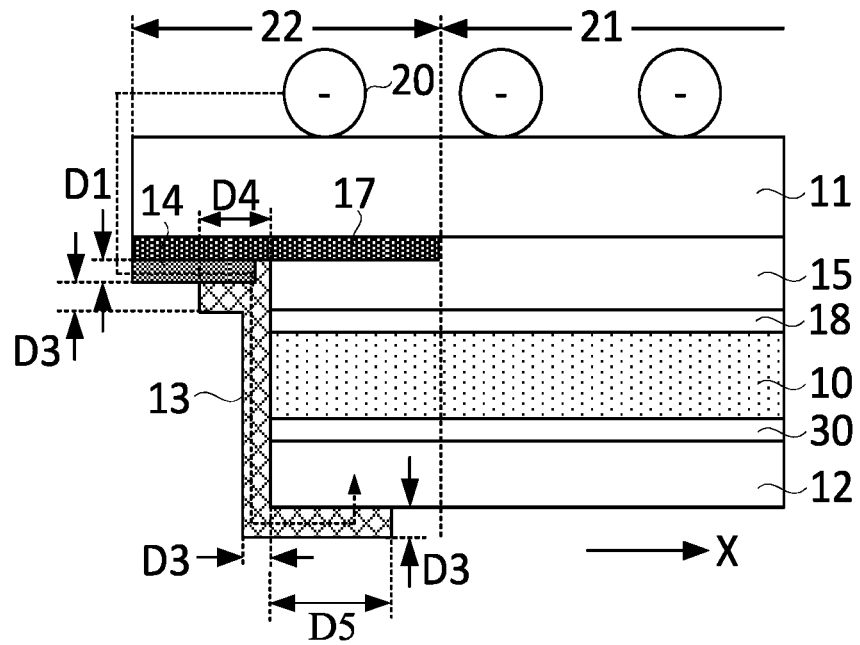
FIG. 9 is a sectional diagram of FIG. 8 taken along a C-C' direction.

FIG. 8 is a structure diagram of another display module provided by an embodiment of the present disclosure. FIG. 9 is a sectional diagram of FIG. 8 taken along a C-C' direction. As shown in FIGS. 8 and 9, the display module provided by the embodiment of the present disclosure may further include a first conductive layer 14. The first conductive layer 14 is located on a side of the cover plate 11 facing the conductive film 13, and the first conductive layer 14 is connected to the cover plate 11 and the conductive film 13 separately. In a direction perpendicular to a plane where the cover plate 11 is located, an overlapping area of the first conductive layer 14 and the cover plate 11 is larger than an overlapping area of the first conductive layer 14 and the conductive film 13.

As shown in FIGS. 8 and 9, the first conductive layer 14 is disposed on the side of the cover plate 11 facing the conductive film 13, and the first conductive layer 14 is connected to the cover plate 11 and the conductive film 13 separately. The first conductive layer 14 is used for conducting charges 20 generated on the cover plate 11 to the conductive film 13, and then the charges 20 are discharged through the conductive shielding layer 12, that is, the charges 20 are sequentially discharged through the first conductive layer 14, the conductive film 13, and the conductive shielding layer 12, preventing a large amount of charges from forming an accumulation of static electricity, thereby reducing the effect of static electricity on the display panel 10.

It is to be noted that the first conductive layer 14 may be connected to the cover plate 11 through a direct contact, or alternatively through another conductive media, as long as the static electricity on the cover plate 11 can be conducted to the first conductive layer 14. Those skilled in the art can set the connection mode between the first conductive layer 14 and the cover plate 11 according to the actual requirements.

Referring to FIGS. 8 and 9, an overlapping area of the first conductive layer 14 and the cover plate 11 is larger than an overlapping area of the first conductive layer 14 and the conductive film 13, that is, in a direction perpendicular to the plane where the cover plate 11 is located, a projection area of the first conductive layer 14 on the plane where the cover plate 11 is located is larger than an overlapping area of a projection area of the conductive film 13 on a plane where the first conductive layer 14 is located. In this embodiment, the overlapping area of the first conductive layer 14 and the cover plate 11 is configured to be larger than the overlapping area of the first conductive layer 14 and the conductive film 13, so that the overlapping area of the first conductive layer 14 and the cover plate 11 is relatively large, which helps to rapidly collect charges generated on the cover plate 11 and reduce the probability of conducting the charges to the display panel 10, thereby reducing the effect of the static electricity on the display panel 10. Moreover, since the overlapping area of the first conductive layer 14 and the cover plate 11 is relatively large and the charges generated on the cover plate 11 are rapidly conducted to the first conductive layer 14, reducing the effect of the static electricity on the display panel 10, the overlapping area of the first conductive layer 14 and the conductive film 13 may be configured to be relatively small, reducing the space occupied by the conductive film 13 while ensuring the conductive film 13 to be effectively and reliably connected to the first conductive layer 14 and the conductive shielding layer 12, thereby reducing the effect of the conductive film 13 on the complete machine assembly space.

Figure 10:
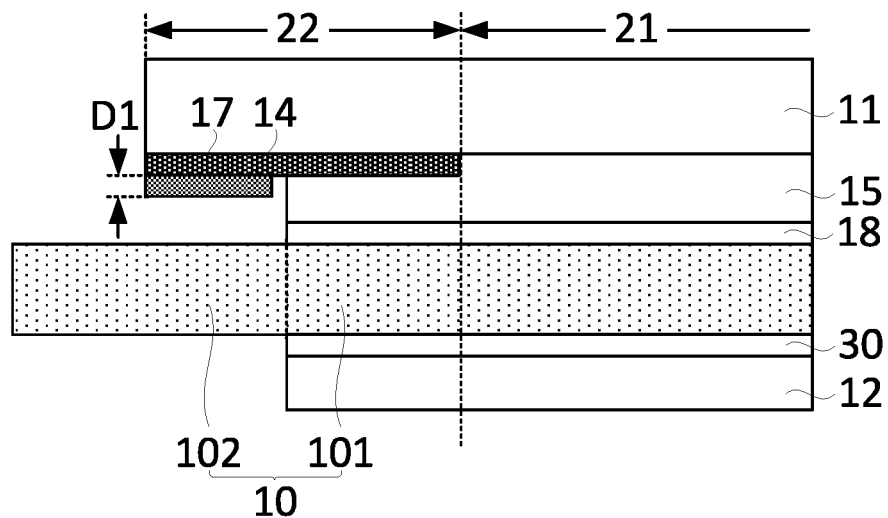
FIG. 10 is a sectional diagram of FIG. 8 taken along a D-D' direction.

FIG. 10 is a sectional diagram of FIG. 8 taken along a D-D' direction. As shown in FIGS. 8 and 10, the display panel 10 may include a main body 101 and a rear folded portion 102, and the first conductive layer 14 at least partially overlaps the rear folded portion 102 in the direction perpendicular to the plane where the cover plate 11 is located.

As shown in FIGS. 8 and 10, since the first conductive layer 14 does not need to be directly connected to the conductive shielding layer 12, configuring the first conductive layer 14 to at least partially overlap the rear folded portion 102 does not affect the connection trace on the rear folded portion 102. In this embodiment, in the direction perpendicular to the plane where the cover plate 11 is located, the first conductive layer 14 is configured to at least partially overlap the rear folded portion 102, so that the static electricity in an area where the rear folded portion 102 is located is rapidly conducted to the first conductive layer 14, thus increasing the dissipation speed of the static electricity in the area where the rear folded portion 102 is located, and preventing the display panel 10 from being damaged by the static electricity in the area where the rear folded portion 102 is located, while not affecting the connection trace on the rear folded portion 102.

Referring to FIG. 8, the first conductive layer 14 may be located on at least one side of the display area 21.

The first conductive layer 14 may be located on one side, two sides, three sides or four sides of the display area 21. In practical configuration, the first conductive layer 14 has various specific design schemes. A typical example is described below in detail, which is not intended to limit the present disclosure.

As shown in FIG. 8, for example, the first conductive layer 14 is located on four sides of the display area 21. The first conductive layer 14 is disposed around the display area 21 to increase the overlapping area of the first conductive layer 14 and the cover plate 11, implementing omnidirectional charge discharging of the cover plate 11, thereby rapidly conducting the static electricity on the cover plate 11 to the first conductive layer 14, reducing the probability of conducting the static electricity to the display panel 10, and reducing the effect of the static electricity on the display panel 10.

Specifically, as shown in FIG. 8, the display panel 10 includes a first boundary 25 and a second boundary 26 disposed opposite to each other, and a third boundary 27 and a fourth boundary 28 disposed opposite to each other. The first conductive layer 14 is disposed on a side of each of the first boundary 25, the second boundary 26, the third boundary 27, and the fourth boundary 28 facing away from the display region 21 so as to increase the overlapping area of the first conductive layer 14 and the cover plate 11, thereby rapidly conducting the static electricity on the cover plate 11 to the conductive shielding layer 14, thus reducing the probability of conducting the static electricity to the display panel 10, and thereby reducing the effect of the static electricity on the display panel 10.

On the basis of the above embodiments, the conductive film 13 may also be located on one side, two sides, three sides or four sides of the display area 21. As shown in FIG. 8, for example, the conductive film 13 is disposed on the side of each of the first boundary 25, the second boundary 26, the third boundary 27 and the fourth boundary 28 facing away from the display area 21 so as to increase the overlapping area of the first conductive layer 14 and the conductive film 13, thereby rapidly conducting the static electricity on the first conductive layer 14 to the conductive film 13, then releasing the static electricity through the conductive shielding layer 12, and thus reducing the effect of the static electricity on the display panel 10.

Figure 11:
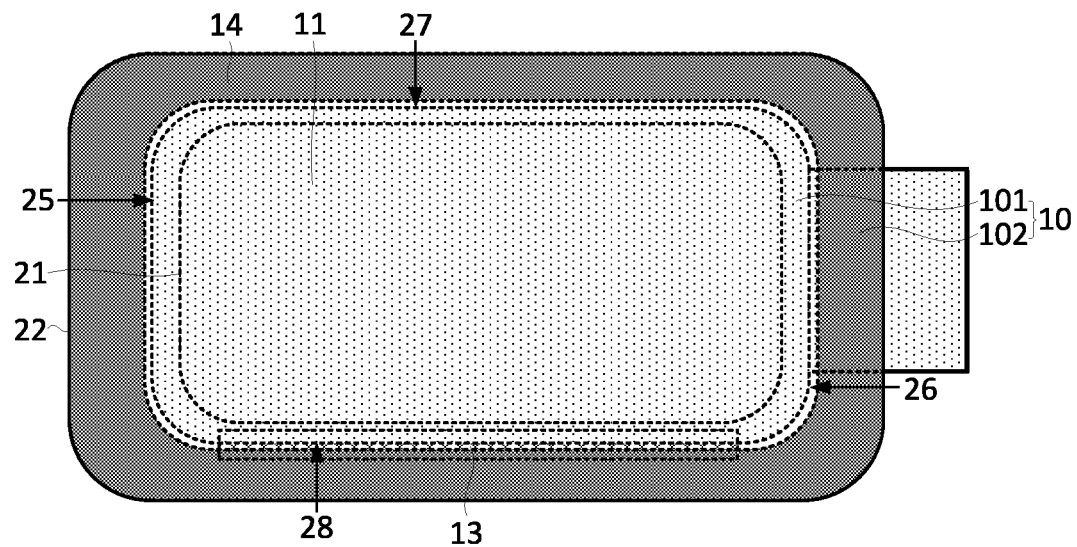
FIG. 11 is a structure diagram of another display module provided by an embodiment of the present disclosure.

FIG. 11 is a structure diagram of another display module provided by an embodiment of the present disclosure. As shown in FIG. 11, for example, the conductive film 13 is disposed merely on the side of the first boundary 25, the second boundary 26, the third boundary 27, or the fourth boundary 28 facing away from the display area 21 (FIG. 11 illustrates an example in which the conductive film 13 is disposed merely on a side of the fourth boundary 28 facing away from the display area 21) to reduce the space occupied by the conductive film 13, thereby reducing the effect of the conductive film 13 on the complete machine assembly space.

Figure 12:
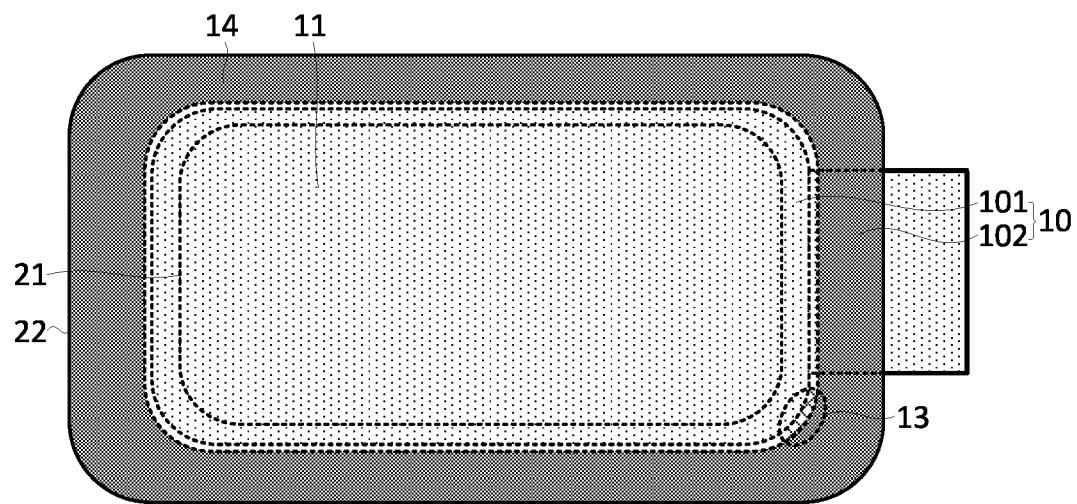
FIG. 12 is a structure diagram of another display module provided by an embodiment of the present disclosure.

Furthermore, FIG. 12 is a structure diagram of another display module provided by an embodiment of the present disclosure. As shown in FIG. 12, the conductive film 13 is merely disposed in a local area to further reduce the space occupied by the conductive film 13, thereby further reducing the effect of the conductive film 13 on the complete machine assembly space.

It is to be noted that, the overlapping area of the first conductive layer 14 and the cover plate 11 can be adjusted according to the requirements or the antistatic capability of the module, and a position of the first conductive layer 14 can also be configured according to actual requirements as long as the overlapping area of the first conductive layer 14 and the cover plate 11 is ensured to be larger than the overlapping area of the first conductive layer 14 and the conductive film 13, which is not limited in the embodiment of the present disclosure.

Referring to FIGS. 8 to 12, the display module provided by the embodiment of the present disclosure may further include a display area 21 and a non-display area 22 disposed around the display area 21, and the first conductive layer 14 is located in the non-display area 22.

Specifically, as shown in FIGS. 8 to 12, the display area 21 of the display module may emit light by configuring multiple sub-pixels arranged in an array to implement the image display. The non-display area 22 disposed around the display area 21 is configured to provide a driving circuit such as a shift register. The non-display area 22 may also be configured to provide a driver chip to drive the sub-pixels of the display area 21, or may also be configured to provide a connection trace to connect the sub-pixels of the display area 21 to the driver chip. In this embodiment, the first conductive layer 14 is disposed in the non-display area 22, so that the effect of the first conductive layer 14 on the display of the display module can be avoided.

It is to be noted that the first conductive layer 14 is not limited to being disposed in the non-display region 22. In other embodiments, the first conductive layer 14 may also include a transparent conductive material, and at least partially overlap the display region 21 in the direction perpendicular to the plane where the cover plate 11 is located.

The first conductive layer 14 includes the transparent conductive material, so that the first conductive layer 14 does not shield the light, and the first conductive layer 14 is configured to at least partially overlap the display area 21 in the direction perpendicular to the plane where the cover plate 11 is located, that is, in a thickness direction of the cover plate 11, at least part of the display area 21 is provided with the first conductive layer 14, so that the static electricity in the area where the display area 21 is located is rapidly conducted to the first conductive layer 14, thus increasing the dissipation speed of the static electricity in the display area 21 and preventing the display area 21 of the display panel 10 from being damaged by the static electricity while not affecting the display effect of the display area 21.

Furthermore, in the direction perpendicular to the plane where the cover plate 11 is located, the first conductive layer 14 may be configured to coincide with the cover plate 11, that is, an edge of the first conductive layer 14 coincides with an edge of the cover plate 11.

An entire layer of first conductive layer 14 is disposed on the cover plate 11, so that the overlapping area of the first conductive layer 14 and the cover plate 11 is increased, implementing omnidirectional charge discharging of the cover plate 11, thereby rapidly conducting the static electricity on the cover plate 11 to the first conductive layer 14, and reducing the probability of conducting the static electricity to the display panel 10, and thereby reducing the effect of the static electricity on the display panel 10.

Referring to FIGS. 1 to 12, the display module further includes an optically clear adhesive (OCA) layer 15 which is located between the display panel 10 and the cover 11, and the display panel 10 is bonded to the cover plate 11 through the OCA layer 15. The OCA is colorless and transparent, and has characteristics of high light transmittance, good bonding strength, small curing shrinkage and the like, and thus the display panel 10 and the cover plate 11 can be well secured while the display effect of the display module is ensured.

Referring to FIGS. 8 to 12, the first conductive layer 14 and the OCA layer 15 may do not overlap in the direction perpendicular to the plane where the cover plate 11 is located.

With continued reference to FIGS. 8 to 12, since the first conductive layer 14 has a certain thickness, the first conductive layer 14 is provided so as not to overlap the OCA layer 15 in the direction perpendicular to the plane where the cover plate 11 is located, that is, in a thickness direction of the cover plate 11, the first conductive layer 14 is not disposed in an area where the OCA layer 15 is located. The first conductive layer 14 is merely located in an area of the display module where the OCA layer 15 is not disposed, so that the first conductive layer 14 can be prevented from contacting the OCA layer 15, thereby preventing the OCA layer 15 from forming bubbles at a step configuration formed at the edge of the first conductive layer 14.

Figure 13:
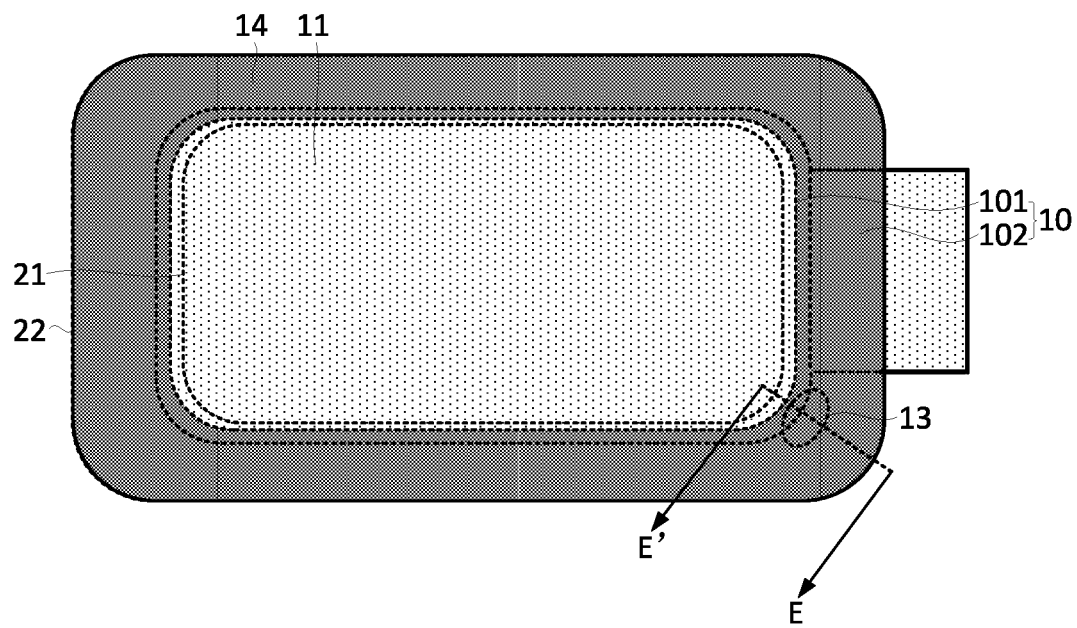
FIG. 13 is a structure diagram of another display module provided by an embodiment of the present disclosure.
Figure 14:
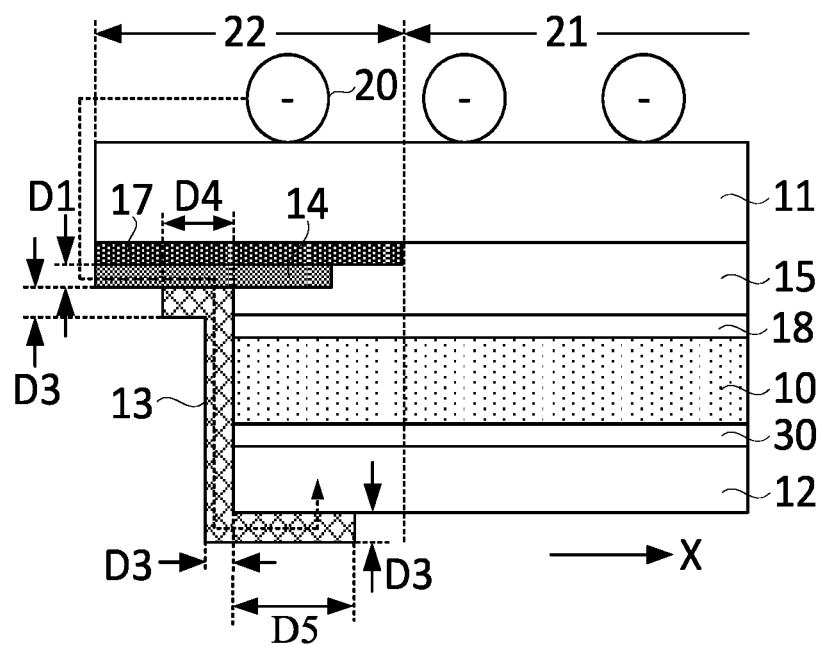
FIG. 14 is a sectional diagram of FIG. 13 taken along an E-E' direction.

FIG. 13 is a structure diagram of another display module provided by an embodiment of the present disclosure. FIG. 14 is a sectional diagram of FIG. 13 taken along an E-E' direction. As shown in FIGS. 13 and 14, the first conductive layer 14 may at least partially overlap the OCA layer 15 in the direction perpendicular to the plane where the cover plate 11 is located.

As shown in FIGS. 13 and 14, the first conductive layer 14 is provided to at least partially overlap the OCA layer 15, that is, in a thickness direction of the cover plate 11, at least part of the area where the OCA layer 15 is located is provided with the first conductive layer 14, which helps to increase the area where the first conductive layer 14 can be provided, thereby increasing the overlapping area of the first conductive layer 14 and the cover plate 11, further accelerating the speed of conducting the static electricity on the cover plate 11 to the first conductive layer 14, and reducing the probability of conducting the static electricity to the display panel 10, and thereby reducing the effect of static electricity on the display panel 10.

Referring to FIGS. 8 to 14, a thickness of the first conductive layer 14 may be D1, where $5\ \mu m \leq D1 \leq 1\ \mu m$.

As shown in FIGS. 8 to 14, if the thickness D1 of the first conductive layer 14 is too small, a resistivity of the first conductive layer 14 is relatively large, which causes the static electricity on the cover plate 11 to be not easily conducted to the first conductive layer 14, and increases the probability of conducting the static electricity to the display panel 10, thereby affecting the display of the display panel 10. In addition, if the thickness D1 of the first conductive layer 14 is too small, the preparation difficulty and the process cost of the first conductive layer 14 will be increased; and if the thickness D1 of the first conductive layer 14 is too large, the space occupied by the first conductive layer 14 will be increased, which increases the effect of the first conductive layer 14 on the design of the structure (the cooperation of the module with the complete machine). In this embodiment, the thickness D1 of the first conductive layer 14 is configured to satisfy $5\ \mu m \leq D1 \leq 15\ \mu m$, so that the effect of the first conductive layer 14 on the complete machine assembly space is reduced while the conductivity of the first conductive layer 14 is ensured.

As shown in FIGS. 13 and 14, in a case where in the direction perpendicular to the plane where the cover plate 11 is located, the first conductive layer 14 at least partially overlaps the OCA layer 15. The thickness D1 is configured to satisfy $5\ \mu m \leq D1 \leq 15\ \mu m$, so that the thickness D1 of the first conductive layer 14 is not too large, avoiding the phenomenon that the too large thickness D1 of the first conductive layer 14 leads to a relatively large step configuration at the position where the first conductive layer 14 contacts the OCA layer 15 resulting in that the OCA layer 15 forms bubbles at the edge of the first conductive layer 14, thereby improving the problem of forming the bubbles in the OCA layer 15.

The first conductive layer 14 may include a conductive ink layer or an indium tin oxide layer.

In the case where the first conductive layer 14 includes the conductive ink layer, on the one hand, the conductive ink layer has the conductivity, which can ensure that the first conductive layer 14 acts as a part of a dissipation path of the static electricity to lead out the static electricity, and on the other hand, the conductive ink layer can shield components such as the driving circuit and the connection trace in the display module, playing a role of modification and improving aesthetics of the display module.

In addition, in the case where the first conductive layer 14 includes the indium tin oxide layer, on the one hand, the indium tin oxide layer has the conductivity, which can ensure that the first conductive layer 14 acts as a part of the dissipation path of the static electricity to lead out the static electricity. and on the other hand, the indium tin oxide layer is relatively thin and light, which helps to reduce the thickness of the first conductive layer 14, thereby reducing the space occupied by the first conductive layer 14 and then reducing the effect of the first conductive layer 14 on the design of the structure (the cooperation of the module with the complete machine).

It is to be noted that, in other embodiments, those skilled in the art understand that other conductive materials can be used to form the first conductive layer 14. In a case where the first conductive layer 14 is located in the non-display area 22, those skilled in the art understand that other conductive materials can be used to form the first conductive layer 14 as long as the first conductive layer 14 has the conductivity, and in a case where the first conductive layer 14 is partially disposed in the display area 21, those skilled in the art understand that other conductive materials can be used to form the first conductive layer 14 as long as the first conductive layer 14 is transparent while having the conductivity, which is not limited by the embodiment of the present disclosure.

Figure 15:
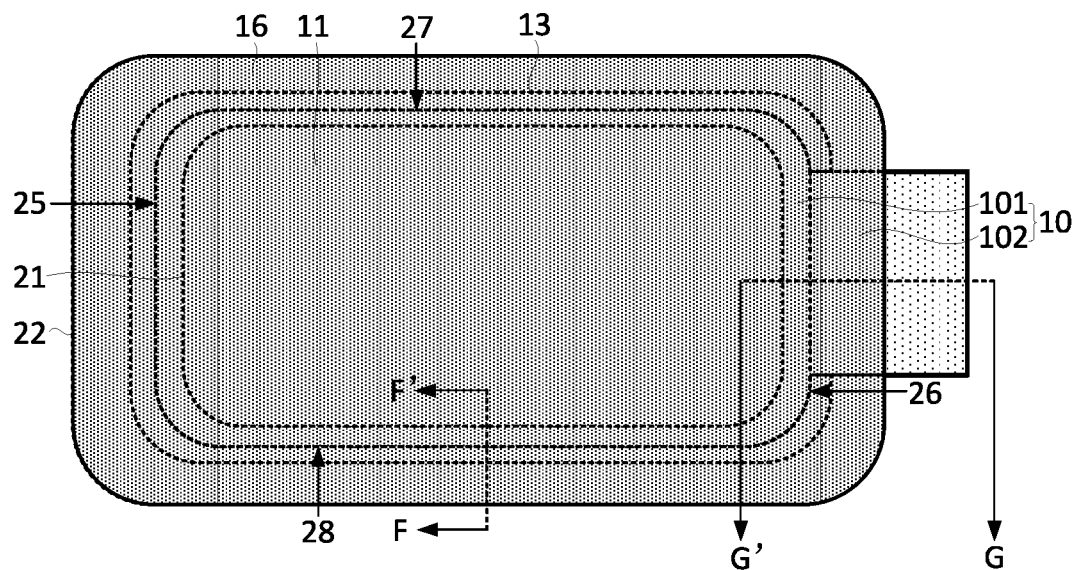
FIG. 15 is a structure diagram of another display module provided by an embodiment of the present disclosure.
Figure 16:
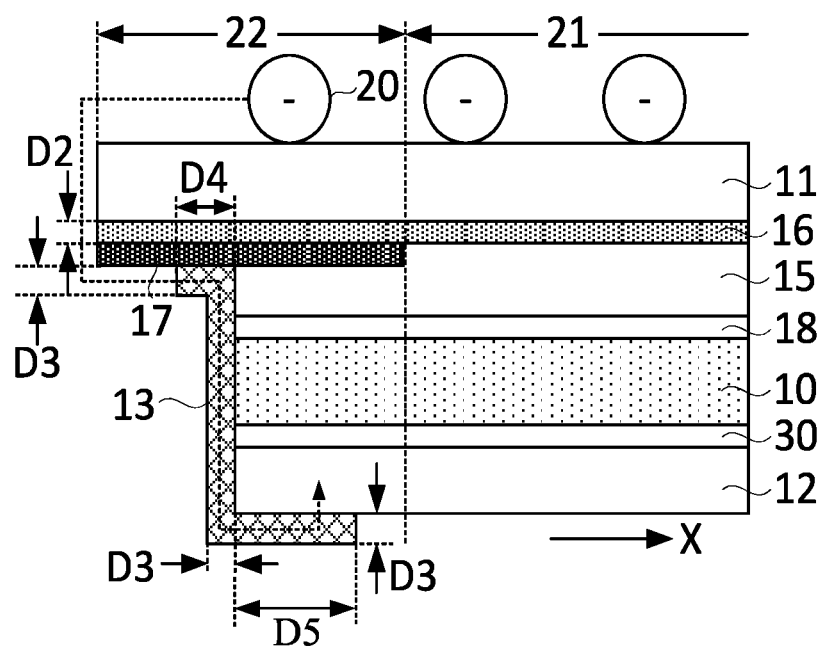
FIG. 16 is a sectional diagram of FIG. 15 taken along an F-F' direction.

FIG. 15 is a structure diagram of another display module provided by an embodiment of the present disclosure. FIG. 16 is a sectional view of FIG. 15 taken along an F-F' direction. As shown in FIGS. 15 to 16, the display module provided by the embodiment of the present disclosure may further include a first transparent conductive layer 16 and a shielding layer 17 which are sequentially disposed on a side of the cover plate 11 facing the display panel 10. The display module further includes a display area 21 and a non-display area 22 disposed around the display area 21, the shielding layer 17 is located in the non-display area 22, and in a direction perpendicular to a plane where the cover plate 11 is located, the first transparent conductive layer 16 at least partially overlaps the display area 21.

As shown in FIGS. 1 to 16, the display module may further include the shielding layer 17 disposed on the side of the cover plate 11 facing the display panel 10. The shielding layer 17 is located in the non-display area 22 and is used for shielding components such as a driving circuit, a driver chip and a connection trace in the non-display area 22 so as to play a role of modification and improve aesthetics of the display module.

Furthermore, in the direction perpendicular to the plane where the cover plate 11 is located, the shielding layer 17 may coincide with the non-display area 22, that is, an edge of the shielding layer 17 coincides with an edge of the non-display area 22, so that the shielding layer 17 completely shields the components such as the driving circuit, the driver chip and the connection trace in the non-display area 22, thereby further improving aesthetics of the display module.

Furthermore, the shielding layer 17 includes an ink layer to implement the shielding of the non-display area 22. The ink layer may be formed by screen printing, and the process is mature and easy to be implemented.

Referring to FIGS. 15 and 16, the display module further includes a first transparent conductive layer 16 that at least partially overlaps the display area 21 in the direction perpendicular to the plane where the cover plate 11 is located.

As shown in FIGS. 15 and 16, the first transparent conductive layer 16 is disposed on the side of the cover plate 11 facing the conductive film 13, and the first transparent conductive layer 16 is connected to the cover plate 11 and the conductive film 13 separately. The first transparent conductive layer 16 is used for conducting charges 20 generated on the cover plate 11 to the conductive film 13, and then the charges 20 are discharged through the conductive shielding layer 12, that is, the charges 20 are discharged through the first transparent conductive layer 16, the conductive film 13, and the conductive shielding layer 12, thus preventing a large amount of charges from forming an accumulation of static electricity, thereby reducing the effect of static electricity on the display panel 10.

It is to be noted that the first transparent conductive layer 16 may be connected to the conductive film 13 through another conductive medium, or alternatively through a direct contact, as long as the static electricity on the cover plate 11 can be conducted to the conductive film 13 through the first transparent conductive layer 16. Those skilled in the art can set the connection mode between the first transparent conductive layer 16 and the conductive film 13 according to the actual requirements.

Referring to FIGS. 15 and 16, in this embodiment, the first transparent conductive layer 16 is provided to at least partially overlap the display area 21 in the direction perpendicular to the plane where the cover plate 11 is located, that is, in a thickness direction of the cover plate 11, at least part of the display area 21 is provided with the first transparent conductive layer 16, so that the static electricity in an area where the display area 21 is located is rapidly conducted to the first transparent conductive layer 16, thus increasing the dissipation speed of the static electricity in the display area 21 and preventing the display area 21 of the display panel 10 from being damaged by the static electricity; and meanwhile, since the first transparent conductive layer 16 does not shield the light, the display function of the display module is not affected.

Referring to FIGS. 15 and 16, the first transparent conductive layer 16 is disposed between the cover plate 11 and the shielding layer 17 so that when the first transparent conductive layer 16 is prepared, firstly, the entire layer of first transparent conductive layer 16 may be prepared on the cover plate 11, and then the shielding layer 17 is prepared on the first transparent conductive layer 16, which avoids preparing the first transparent conductive layer 16 on the shielding layer 17 with uneven surface and weak adsorption. Thus, the process difficulty is reduced, and the structure is easy to achieve.

Referring to FIGS. 15 and 16, an overlapping area of the first transparent conductive layer 16 and the cover plate 11 is larger than an overlapping area of the conductive film 13 and the cover plate 11 in the direction perpendicular to the plane where the cover plate 11 is located.

As shown in FIGS. 15 and 16, the overlapping area of the first transparent conductive layer 16 and the cover plate 11 refers to a projection area of the first transparent conductive layer 16 on the plane where the cover plate 11 is located in the direction perpendicular to the plane where the cover plate 11 is located. The overlapping area of the conductive film 13 and the cover plate 11 refers to a projection area of the conductive film 13 on the plane where the cover plate 11 is located in the direction perpendicular to the plane where the cover plate 11 is located. That is, in the direction perpendicular to the plane where the cover plate 11 is located, the projection area of the first transparent conductive layer 16 on the plane where the cover plate 11 is located is larger than the projection area of the conductive film 13 on the plane where the cover plate 11 is located. In this embodiment, the overlapping area of the first transparent conductive layer 16 and the cover plate 11 is configured to be larger than the overlapping area of the conductive film 13 and the cover plate, so that the overlapping area of the first transparent conductive layer 16 and the cover plate 11 is relatively large, which helps to rapidly collect charges generated on the cover plate 11 and reduce the probability of conducting the charges to the display panel 10, thereby reducing the effect of the static electricity on the display panel 10. Moreover, since the overlapping area of the first transparent conductive layer 16 and the cover plate 11 is relatively large and the charges generated on the cover plate 11 are rapidly conducted to the first transparent conductive layer 16, reducing the effect of the static electricity on the display panel 10, the overlapping area of the conductive film 13 and the cover plate 11 may be configured to be relatively small, thus reducing the space occupied by the conductive film 13 while ensuring the conductive film 13 is effectively and reliably connected to the first transparent conductive layer 16 and the conductive shielding layer 12, thereby reducing the effect of the conductive film 13 on the complete machine assembly space.

Figure 17:
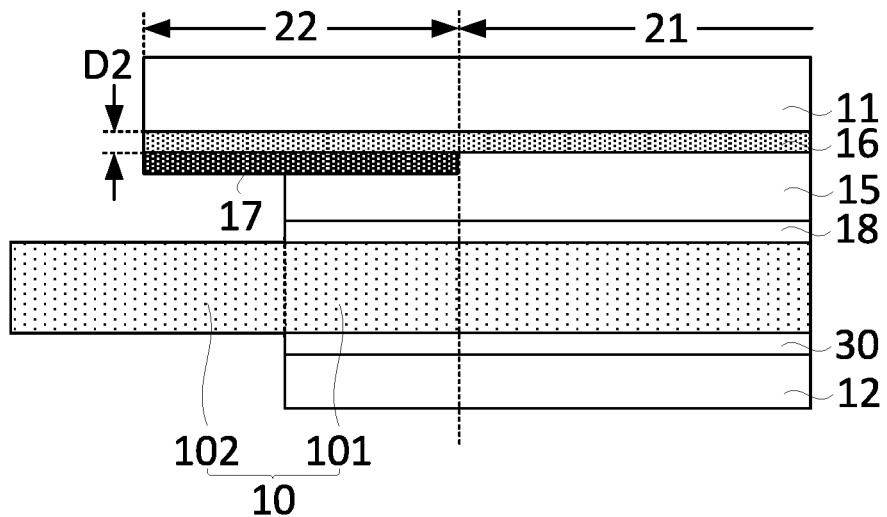
FIG. 17 is a sectional diagram of FIG. 15 taken along a G-G' direction.

FIG. 17 is a sectional diagram of FIG. 15 taken along a G-G' direction. As shown in FIGS. 15 and 17, the display panel 10 may include a main body 101 and a rear folded portion 102, and the first transparent conductive layer 16 at least partially overlaps the rear folded portion 102 in the direction perpendicular to the plane where the cover plate 11 is located.

As shown in FIGS. 15 and 17, in this embodiment, the first transparent conductive layer 16 is configured to at least partially overlap the rear folded portion 102 in the direction perpendicular to the plane where the cover plate 11 is located, that is, in the thickness direction of the cover plate 11, at least part of an area where the rear folded portion 102 is located is provided with the first transparent conductive layer 16, so that the static electricity in the area where the rear folded portion 102 is located is rapidly conducted to the first transparent conductive layer 16, thus increasing the dissipation speed of the static electricity in the area where the rear folded portion 102 is located, and preventing the display panel 10 from being damaged by the static electricity in the area where the rear folded portion 102 is located; and meanwhile, since the first transparent conductive layer 16 does not need to be directly connected to the conductive shielding layer 12, the first transparent conductive layer 16 is configured to at least partially overlap the rear folded portion 102, so that the connection trace on the rear folded portion 102 is not affected.

Referring to FIG. 15, in the direction perpendicular to the plane where the cover plate 11 is located, the first transparent conductive layer 16 is located may coincide with the cover plate 11, that is, an edge of the first transparent conductive layer 16 coincides with an edge of the cover plate 11.

An entire layer of first transparent conductive layer 16 is disposed on the cover plate 11, so that the overlapping area of the first transparent conductive layer 16 and the cover plate 11 is increased, thus implementing omnidirectional charge discharging of the cover plate 11, thereby rapidly conducting the static electricity on the cover plate 11 to the first transparent conductive layer 16, and reducing the probability of conducting the static electricity to the display panel 10, thereby reducing the effect of the static electricity on the display panel 10.

On the basis of the above embodiments, the conductive film 13 may be located on at least one side of the display area 21. As shown in FIG. 15, for example, the conductive film 13 is disposed on the side of each of the first boundary 25, the second boundary 26, the third boundary 27 and the fourth boundary 28 facing away from the display area 21 so as to increase the overlapping area of the first transparent conductive layer 16 and the conductive film 13, thereby rapidly conducting the static electricity on the first transparent conductive layer 16 to the conductive film 13, and then releasing the static electricity through the conductive shielding layer 12, thus reducing the effect of the static electricity on the display panel 10.

Figure 18:
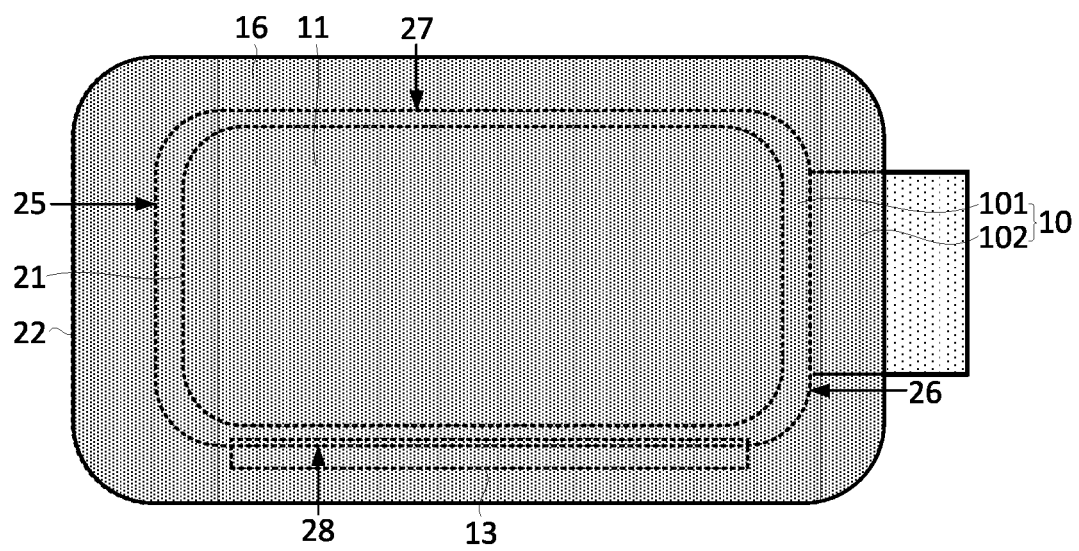
FIG. 18 is a structure diagram of another display module provided by an embodiment of the present disclosure.

FIG. 18 is a structure diagram of another display module provided by an embodiment of the present disclosure. As shown in FIG. 18, for example, the conductive film 13 is disposed merely on the side of the first boundary 25, the second boundary 26, the third boundary 27, or the fourth boundary 28 facing away from the display area 21 (FIG. 18 illustrates an example in which the conductive film 13 is disposed merely on a side of the fourth boundary 28 facing away from the display area 21) to reduce the space occupied by the conductive film 13, thereby reducing the effect of the conductive film 13 on the complete machine assembly space.

Figure 19:
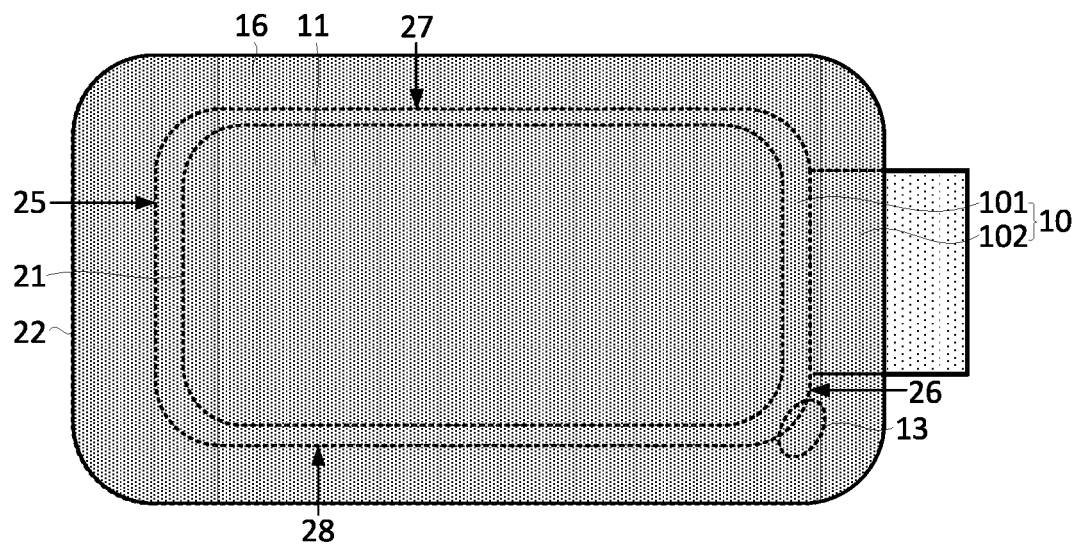
FIG. 19 is a structure diagram of another display module provided by an embodiment of the present disclosure.

Furthermore, FIG. 19 is a structure diagram of another display module provided by an embodiment of the present disclosure. As shown in FIG. 19, the conductive film 13 is merely disposed in a local area to further reduce the space occupied by the conductive film 13, thereby further reducing the effect of the conductive film 13 on the complete machine assembly space.

It is to be noted that, the overlapping area of the first transparent conductive layer 16 16 and the cover plate 11 can be adjusted according to specific requirements or the antistatic capability of the module, and a position of the first transparent conductive layer 16 can also be configured according to actual requirements as long as the overlapping area of the first transparent conductive layer 16 and the cover plate 11 is ensured to be larger than the overlapping area of the conductive film 13 and the cover plate 11, which is not limited in the embodiment of the present disclosure.

The first transparent conductive layer 16 may include at least one of indium tin oxide, indium zinc oxide, indium tin zinc oxide, antimony tin oxide, aluminum zinc oxide, gallium zinc oxide, zinc oxide, or indium oxide.

The above material has a good conductivity and does not affect the light transmittance, thus ensuring the display effect of the display module while the first transparent conductive layer 16 is ensured to serve as the dissipation path of the static electricity.

It is to be noted that, in other embodiments, the first transparent conductive layer 16 may be made of other transparent conductive materials, which is not limited by the embodiment of the present disclosure.

Referring to FIGS. 15 to 19, a thickness of the first transparent conductive layer 16 may be D2, where 1 µm≤D2≤2 µm.

In this embodiment, the thickness D2 of the first transparent conductive layer 16 is configured to be 1 µm≤D2≤2 µm. On the one hand, the conductivity of the first transparent conductive layer 16 is ensured, the preparation difficulty of the first transparent conductive layer 16 is reduced, the problem is avoided that a relatively large resistivity of the first transparent conductive layer 16 due to the too small thickness D2 of the first transparent conductive layer 16 causes the static electricity on the cover plate 11 to be not easily conducted to the first transparent conductive layer 16, the probability of conducting the static electricity to the display panel 10 is increased and the display of the display panel 10 is affected. Meanwhile, the problem is solved that the preparation difficulty and the process cost of the first transparent conductive layer 16 is increased due to the too small thickness D2 of the first transparent conductive layer 16. On the other hand, the space occupied by the first transparent conductive layer 16 is reduced, and the transmittance of the first transparent conductive layer 16 is improved. The problem is avoided that the increase of the space occupied by the first transparent conductive layer 16 due to the too large thickness D2 of the first transparent conductive layer 16 affects the design of the structure (the cooperation of the module with the complete machine). Furthermore, the problem is solved that the reduction of the transmittance of the first transparent conductive layer 16 due to the too large thickness D2 of the first transparent conductive layer 16 ultimately affects the display effect of the display module.

Figure 20:
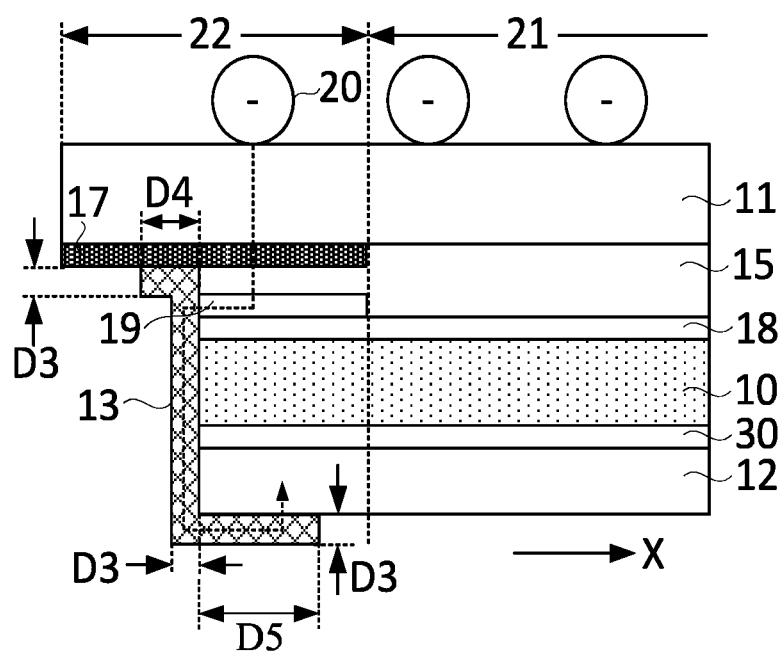
FIG. 20 is a partial sectional diagram of another display module provided by an embodiment of the present disclosure.

To clearly show the relative positional relationship between the conductive film 13 and the display panel 10, it is to be noted that top views (such as FIGS. 1, 5, 6, 8, 11, 12, 13, 15, 18 and 19) provided by the present disclosure show structures of the conductive film 13 and the display panel 10. In the top views, the conductive film 13 and the display panel 10 are shielded by the cover plate 11. In addition, since the shielding layer 17 is located on the side of the cover plate 11 facing the display panel 10, the shielding layer 17 is shielded by the cover plate 11 in the above top views. Therefore, the shielding layer 17 is not shown in the above top views. FIG. 20 is a partial sectional diagram of another display module provided by an embodiment of the present disclosure. As shown in FIG. 20, the display module provided by the embodiment of the present disclosure may further include a polarizer 18, an OCA layer 15 and a second conductive layer 19. The polarizer 18 is located on a side of the display panel 10 facing the cover plate 11, the OCA layer 15 is located on the side of the polarizer 18 facing the cover plate 11, the second conductive layer 19 is located between the polarizer 18 and the OCA 15, and the second conductive layer 19 is connected to the conductive film 13.

As shown in FIGS. 1 to 20, the polarizer 18 is disposed on the side of the display panel 10 facing the cover plate 11. The polarizer 18 can reduce the reflected light of the metal layer in the display module, which helps to improve the display effect of the display module. An adhesive layer may be disposed on the side of the polarizer 18 facing the display panel 10 to bond the polarizer 18 to the display panel 10.

Referring to FIGS. 1 to 20, the OCA layer 15 may be disposed on the side of the polarizer 18 facing the cover plate 11, and the polarizer 18 is bonded to the cover plate 11 through the OCA layer 15. The OCA is colorless and transparent, and has characteristics of high light transmittance, good bonding strength, small curing shrinkage and the like, and thus the display panel 10 and the cover plate 11 can be well secured while the display effect of the display module is ensured.

Referring to FIG. 20, the second conductive layer 19 may be disposed between the polarizer 18 and the OCA layer 15, and the second conductive layer 19 is connected to the conductive film 13. The second conductive layer 19 is used for conducting charges 20 generated on the cover plate 11 to the conductive film 13, and then the charges 20 are released through the conductive shielding layer 12, that is, the charges 20 are sequentially released through the second conductive layer 19, the conductive film 13 and the conductive shielding layer 12, preventing a large amount of charges from forming an accumulation of static electricity, thereby reducing the effect of static electricity on the display panel 10.

Referring to FIG. 20, the second conductive layer 19 may be located in the non-display area 22, and the second conductive layer 19 is located on at least one side of the display area 21.

The second conductive layer 19 is disposed in the non-display area 22, so that the effect of the second conductive layer 19 on the display of the display module can be avoided.

In addition, the second conductive layer 19 may be located on one side, two sides, three sides or four sides of the display area 21 as long as the second conductive layer 19 is ensured to be connected to the conductive film 13, which can be set by those skilled in the art according to actual requirements.

Figure 21:
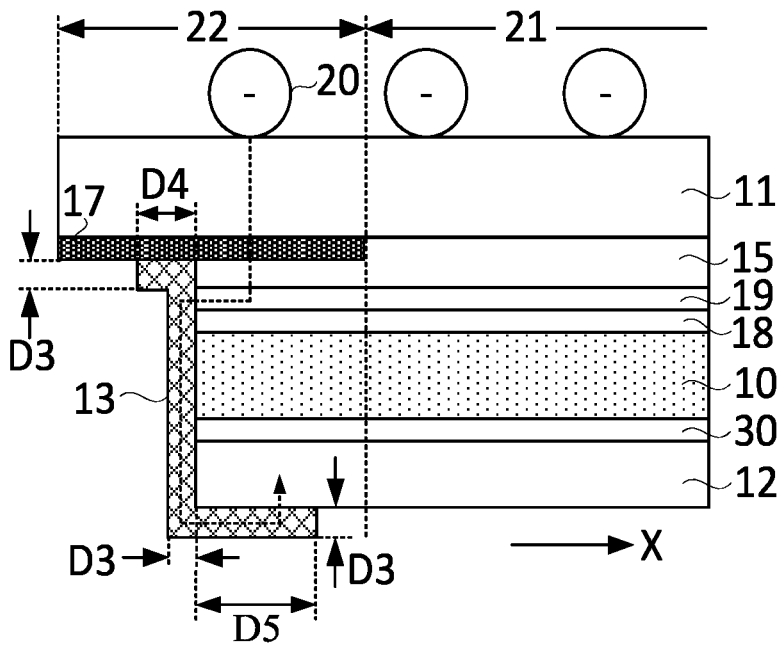
FIG. 21 is a partial sectional diagram of another display module provided by an embodiment of the present disclosure.

FIG. 21 is a partial sectional diagram of another display module provided by an embodiment of the present disclosure. As shown in FIG. 21, the second conductive layer 19 may include a transparent conductive material, and the second conductive layer 19 at least partially overlaps the display area 21 in the direction perpendicular to the plane where the cover plate 11 is located.

As shown in FIG. 21, the second conductive layer 19 is configured to include the transparent conductive material, so that the second conductive layer 19 does not shield the light, and the second conductive layer 19 is configured to at least partially overlap the display area 21 in the direction perpendicular to the plane where the cover plate 11 is located, that is, in a thickness direction of the cover plate 11, at least part of the display area 21 is provided with the second conductive layer 19, so that the static electricity in the area where the display area 21 is located is rapidly conducted to the second conductive layer 19, increasing the dissipation speed of the static electricity in the display area 21 and preventing the display area 21 of the display panel 10 from being damaged by the static electricity while not affecting the display effect of the display area 21.

Referring to FIG. 21, in the direction perpendicular to the plane where the cover plate 11 is located, the second conductive layer 19 may coincide with the polarizer 18, that is, an edge of the second conductive layer 19 coincides with an edge of the polarizer 18.

An entire layer of second conductive layer 19 is disposed on the polarizer 18, so that the overlapping area of the second conductive layer 19 and the cover plate 11 is increased, thus implementing omnidirectional charge discharging of the cover plate 11, thereby rapidly conducting the static electricity on the cover plate 11 to the second conductive layer 19, and reducing the probability of conducting the static electricity to the display panel 10, thereby reducing the effect of the static electricity on the display panel 10.

Figure 22:
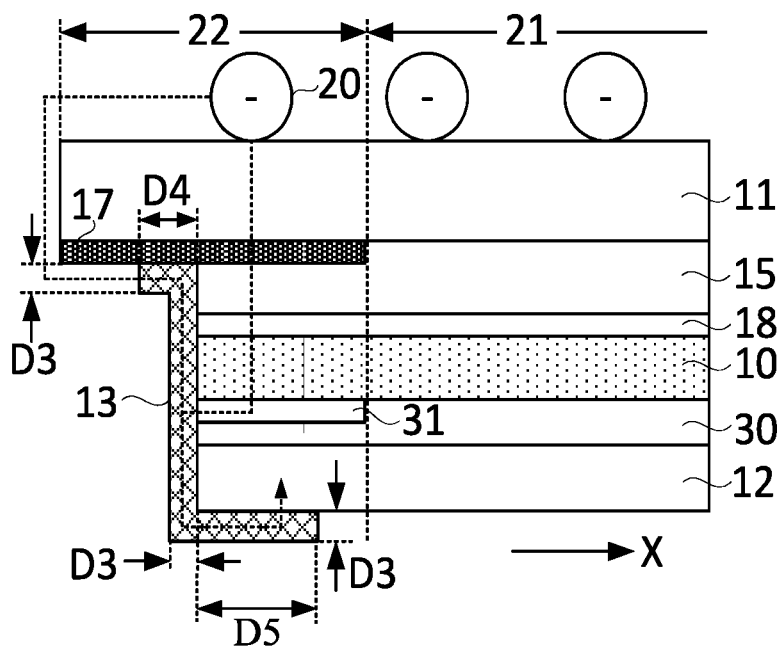
FIG. 22 is a partial sectional diagram of another display module provided by an embodiment of the present disclosure.

FIG. 22 is a partial sectional diagram of another display module provided by an embodiment of the present disclosure. As shown in FIG. 22, the display module provided by the embodiment of the present disclosure may further include a protective layer 30 and a third conductive layer 31. The protective layer 30 is located between the display panel 10 and the conductive shielding layer 12. The third conductive layer 31 is located between the display panel 10 and the protective layer 30, and/or the third conductive layer 31 is located between the protective layer 30 and the conductive shielding layer 12; and the third conductive layer 31 is connected to the conductive film 13.

As shown in FIGS. 1 to 22, the protective layer 30 is disposed between the display panel 10 and the conductive shielding layer 12, and the protective layer 30 may include a material such as a polyimide (PI) to support and protect the display panel 10.

Referring to FIG. 22, the third conductive layer 31 may be disposed between the display panel 10 and the protective layer 30, and/or between the protective layer 30 and the conductive shielding layer 12, and the third conductive layer 31 is connected to the conductive film 13. The third conductive layer 31 may conduct charges 20 on the display panel 10 to the conductive film 13, and then the charges 20 are discharged through the conductive shielding layer 12, that is, the charges 20 are discharged through the third conductive layer 31, the conductive film 13, and the conductive shielding layer 12, preventing a large amount of charges from accumulating, thereby reducing the effect of static electricity on the display panel 10.

Figure 23:
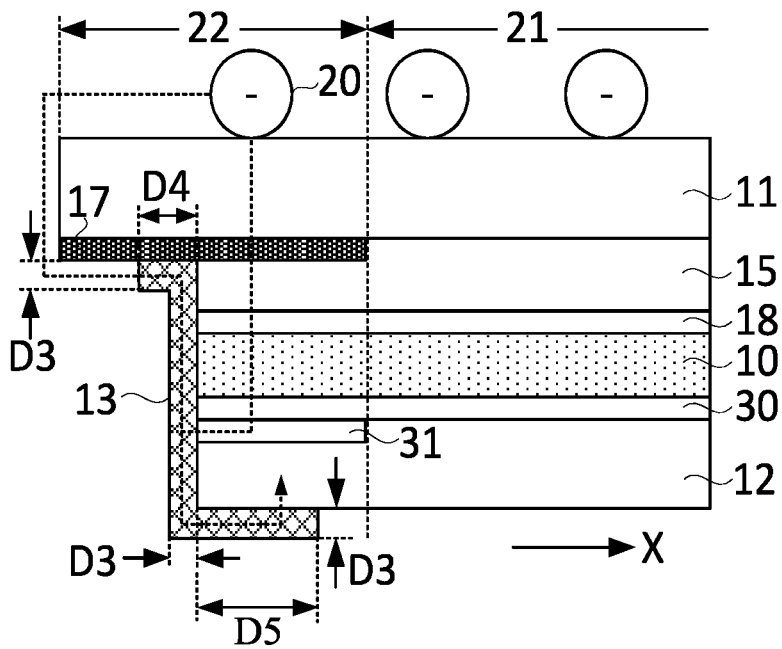
FIG. 23 is a partial sectional diagram of another display module provided by an embodiment of the present disclosure.

It is to be noted that FIG. 22 merely illustrates an example in which the third conductive layer 31 is located between the display panel 10 and the protective layer 30. FIG. 23 is a partial sectional diagram of another display module provided by an embodiment of the present disclosure. As shown in FIG. 23, the third conductive layer 31 may also be located between the protective layer 30 and the conductive shielding layer 12. In other embodiments, the third conductive layer 31 may also be located both between the display panel 10 and the protective layer 30 and between the protective layer 30 and the conductive shielding layer 12, which can be set by those skilled in the art according to actual requirements.

Referring to FIGS. 22 and 23, in an exemplary embodiment, the third conductive layer 31 is located in the non-display area 22, and the third conductive layer 31 is located on at least one side of the display area 21.

The third conductive layer 31 is disposed in the non-display area 22, so that the effect of the third conductive layer 31 on the display of the display module can be avoided.

In addition, the third conductive layer 31 may be located on one side, two sides, three sides or four sides of the display area 21 as long as the third conductive layer 31 is ensured to be connected to the conductive film 13, which can be set by those skilled in the art according to actual requirements.

Figure 24:
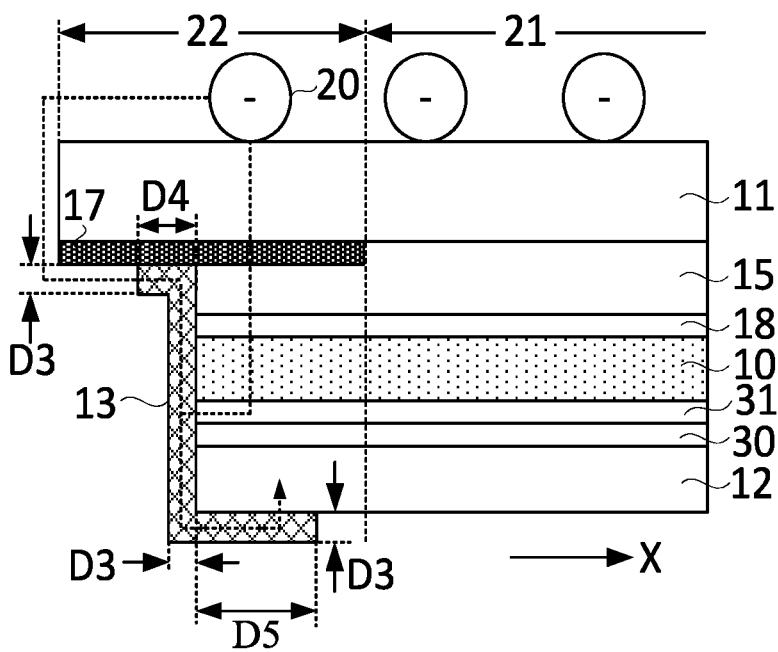
FIG. 24 is a partial sectional diagram of another display module provided by an embodiment of the present disclosure.
Figure 25:
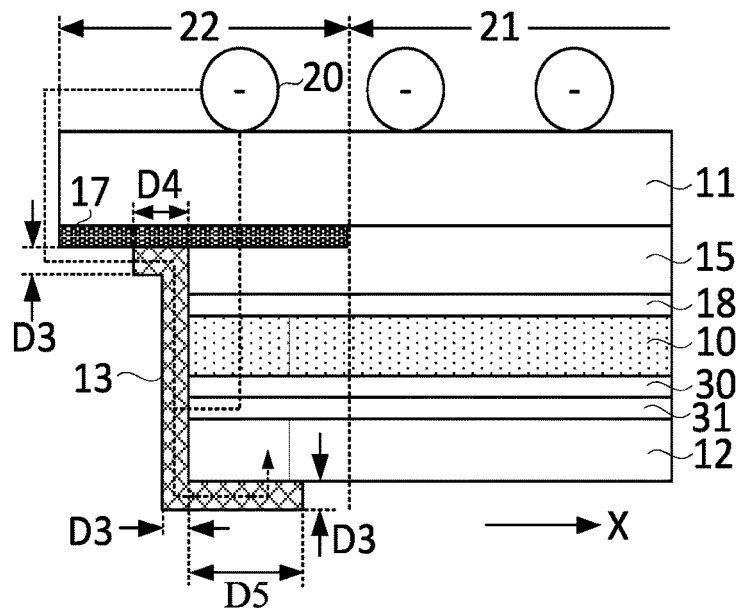
FIG. 25 is a partial sectional diagram of another display module provided by an embodiment of the present disclosure.

FIG. 24 is a partial sectional diagram of another display module provided by an embodiment of the present disclosure. FIG. 25 is a partial sectional diagram of another display module provided by an embodiment of the present disclosure. As shown in FIGS. 24 and 25, in an example embodiment, the third conductive layer 31 includes a transparent conductive material, and the third conductive layer 31 at least partially overlaps the display area 21 in a direction perpendicular to a plane where the cover plate 11 is located.

As shown in FIGS. 24 and 25, the third conductive layer 31 is configured to include the transparent conductive material, so that the third conductive layer 31 does not shield the light, and the third conductive layer 31 is configured to at least partially overlap the display area 21 in the direction perpendicular to the plane where the cover plate 11 is located, that is, in a thickness direction of the cover plate 11, at least part of the display area 21 is provided with the third conductive layer 31, so that the static electricity in the area where the display area 21 is located is rapidly conducted to the third conductive layer 31, increasing the dissipation speed of the static electricity in the display area 21 and preventing a large amount of charges from accumulating in the display area 21 of the display panel 10 while not affecting the display effect of the display area 21.

Referring to FIGS. 24 and 25, in the direction perpendicular to the plane where the cover plate 11 is located, the third conductive layer 31 may coincide with the protective layer 30, that is, an edge of the third conductive layer 31 coincides with an edge of the protective layer 30.

The entire layer of third conductive layer 31 is disposed on the protective layer 30, so that the overlapping area of the third conductive layer 31 and the display panel 10 is increased, thus implementing omnidirectional charge discharging of the display panel 10, thereby rapidly conducting the charges on the display panel 11 to the third conductive layer 31, and reducing the charge accumulation on the display panel 10, thereby reducing the effect of static electricity on the display panel 10.

Referring to FIGS. 1 to 25, the conductive film 13 may be in contact with a side wall of a film layer such as the polarizer 18, the display panel 10, the protective layer 30 and the like, which helps to conduct the charges 20 on each film layer to the conductive film 13 and then discharge the charges 20 through the conductive shielding layer 12, preventing a large amount of charges on each film layer from accumulating so as to reduce the effect of static electricity on the display panel 10.

Referring to FIGS. 1 to 25, a thickness of the conductive film 13 may be D3, where $D1 \leq 50$ µm.

As shown in FIGS. 1 to 25, if the thickness D3 of the conductive film 13 is too large, the space occupied by the conductive film 13 will be increased, which increases the effect of the conductive film 13 on the design of the structure (the cooperation of the module with the complete machine). In this embodiment, the thickness D3 of the conductive film 13 is configured to satisfy $D3 \leq 50$ µm, so that the space occupied by the conductive film 13 is reduced, thereby reducing the effect of the conductive film 13 on the complete machine assembly space.

Referring to FIGS. 1 to 25, a contact area of the conductive film 13 and the shielding layer 17 may have a length of D4 in a first direction X, where $D4 \leq 0.3$ mm. The first direction X is a direction in which the non-display area 22 points to the display area 21.

As shown in FIGS. 1 to 25, if the length of D4 of the contact area of the conductive film 13 and the shielding layer 17 in the first direction X is too large, the space occupied by the conductive film 13 is increased, thus the effect of the conductive film 13 on the design of the structure (the cooperation of the module with the complete machine) is increased. In this embodiment, the length of D4 of the contact area of the conductive film 13 and the shielding layer 17 in the first direction X is configured to satisfy $D4 \leq 0.3$ mm, so that the effect of the conductive film 13 on the complete machine assembly space is reduced.

It is to be noted that the length of D4 of the contact area of the conductive film 13 and the shielding layer 17 in the first direction X is not limited to D4≤0.3 mm. In other embodiments, those skilled in the art can configured the length of D4 of the contact area of the conductive film 13 and the shielding layer 17 in the first direction X according to the actual situation.

For example, in the display module shown in FIGS. 8 to 14, since the position of the first conductive layer 14 has a process variation, the length of D4 may be configured to be D4≤0.5 mm to ensure that the conductive film 13 and the shielding layer 17 have a large enough contact area, so that the conductivity of the conductive film 13 can be ensured.

Referring to FIGS. 1 to 25, a contact area of the conductive film 13 and the conductive shielding layer 12 may have a length of D5 in the first direction X, where 0.5 mm≤D5≤2.0 mm. The first direction X is a direction in which the non-display area 22 points to the display area 21.

As shown in FIGS. 1 to 25, in this embodiment, the length of D5 of the contact area of the conductive film 13 and the conductive shielding layer 12 in the first direction X is configured to satisfy 0.5 mm≤D5≤2.0 mm. On the one hand, the preparation difficulty and the process cost of the conductive film 13 will be increased if the length of D5 of the contact area of the conductive film 13 and the conductive shielding layer 12 in the first direction X is too small. On the other hand, if the length of D5 of the contact area of the conductive film 13 and the conductive shielding layer 12 in the first direction X is too large, the space occupied by the conductive film 13 will be increased, and thereby, the effect of the conductive film 13 on the design of the structure (the cooperation of the module with the complete machine) will be increased With the above configuration, the effect of the conductive film 13 on the complete machine assembly space is reduce while the process difficulty is reduced.

Figure 26:
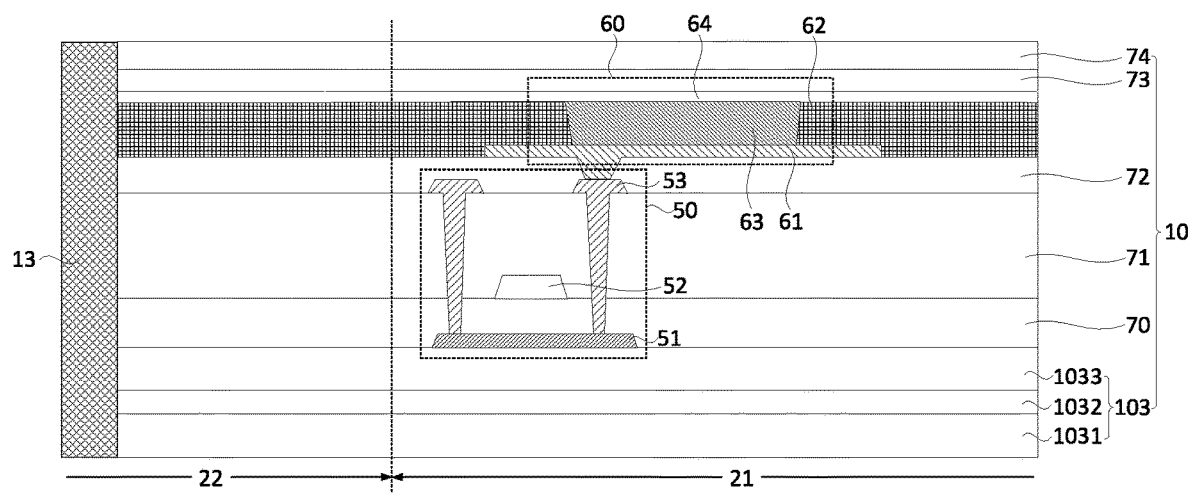
FIG. 26 is a partial sectional diagram of another display module provided by an embodiment of the present disclosure.

FIG. 26 is a partial sectional diagram of another display module provided by an embodiment of the present disclosure. As shown in FIG. 26, for example, the display panel 10 is a flexible organic light emitting diode (OLED) display panel, and the display panel 10 may include a pixel driving circuit and a light-emitting unit 60 which are sequentially disposed on a side of a substrate 103. The pixel driving circuit is used for driving the light-emitting unit 60 to emit light so as to achieve the display function. The pixel driving circuit includes a thin film transistor 50. The thin film transistor 50 includes an active layer 51, a gate layer 52, and a source/drain electrode layer 53 stacked on the side of the substrate 103. The light-emitting unit 60 includes an anode 61, a pixel defining layer 62, an organic light-emitting layer 63 and a cathode layer 64 that are stacked. Electrons and holes are injected to the organic light-emitting layer 63 from the cathode layer 64 and the anode 61 respectively, and excitons are formed in the organic light-emitting layer 63 so that light-emitting molecules are excited, thereby causing the organic light-emitting layer 63 to emit visible light.

Referring to FIG. 26, the display panel 10 may further include a gate insulating layer 70 located between the active layer 51 and the gate layer 52, an interlayer insulating layer 71 located between the gate layer 52 and the source/drain electrode layer 53, and a planarization layer 72 located between the source/drain electrode layer 53 and the anode 61.

Referring to FIG. 26, the display panel 10 further includes an encapsulation layer 73 on a side of the cathode layer 64 facing away from the substrate 103, and the encapsulation layer 73 is used for providing water and oxygen protection for the light-emitting unit 60. The encapsulation layer 73 may be a thin film encapsulation layer, and the thin film encapsulation layer may include a three-layer structure of an inorganic layer/an organic layer/an inorganic layer, and has advantages of lightness, thinness, flexibility and the like while isolating the water vapor.

Referring to FIG. 26, the display panel 10 may further include a touch electrode layer 74 on a side of the encapsulation layer 73 facing away from the substrate 103 in order to implement a touch function.

Referring to FIG. 26, the substrate 103 may include a first substrate 1031, a buffer layer 1032 and a second substrate 1033 that are stacked. The buffer layer 1032 can play a role of shakeproof, buffer and isolation. When the display panel 10 is prepared, a layer of substrate material may be first coated on a rigid substrate to form the first substrate 1031, the buffer layer 1032 is formed on the first substrate 1031, a layer of substrate material is coated on the buffer layer 1032 to form the second substrate 1033, the pixel driving circuit and the light-emitting unit 60 is prepared on the second substrate 1033, and then the display panel 10 is encapsulated. Finally, the first substrate 1031 is peeled off from the rigid substrate by a laser peeling process, and a part not irradiated by the laser may be damaged during the peeling. A double-layer substrate can prevent the pixel driving circuit and the light-emitting unit 60 from losing protection after the first substrate 1031 is damaged during the laser peeling process.

Referring to FIG. 26, the conductive film 13 may be in contact with insulating layers (the substrate 103, the gate insulating layer 70, the interlayer insulating layer 71, the planarization layer 72, the encapsulation layer 73 and the like) in the display panel 10, which helps to conduct the charges on each film layer to the conductive film 13 while not affecting the display of the display panel and then discharge the charges, thereby preventing a large amount of charges from accumulating on the display panel 10 and reducing the effect of static electricity on the display panel 10.

It is to be noted that the above embodiment merely uses the display panel being a flexible OLED display panel as an example. In other embodiments, those skilled in the art can arbitrarily set the type and structure of the display panel 10, which is not limited by the embodiment of the present disclosure.

Figure 27:
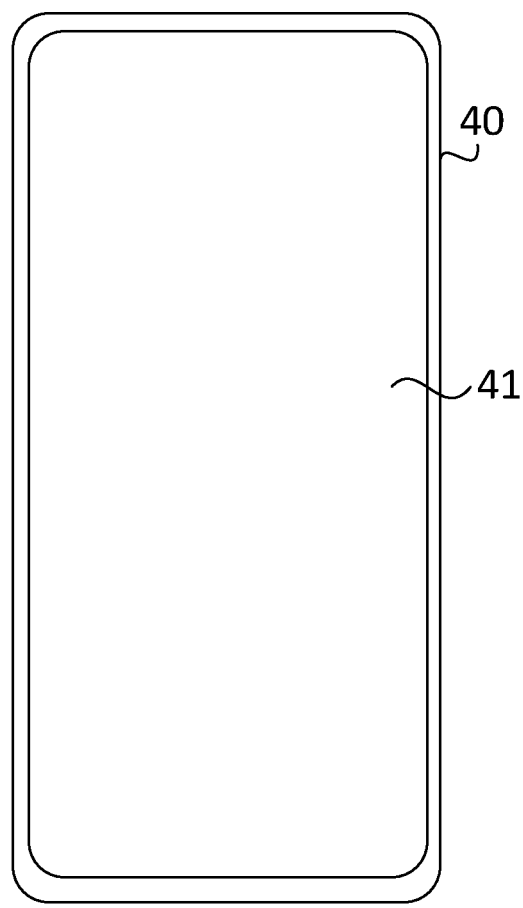
FIG. 27 is a structure diagram of a display device provided by an embodiment of the present disclosure.

Based on the above descriptions, an embodiment of the present disclosure also provides a display device. FIG. 27 is a structure diagram of a display device provided by an embodiment of the present disclosure. As shown in FIG. 27, the display device 40 includes the display module 41 described in any embodiment of the present disclosure. Therefore, the display device 40 provided by the embodiment of the present disclosure has the technical effects of the technical solution of any one of the embodiments described above, and the same or corresponding structure and the explanation of terms as those in the preceding embodiments will not be repeated here. The display device 40 provided by the embodiment of the present disclosure may be the phone shown in FIG. 27, or may be any electronic product with a display function, including but not limited to: televisions, laptops, desktop displays, tablet computers, digital cameras, smart bracelets, smart glasses, in-vehicle displays, medical displays, industrial control equipment, touch interactive terminals, etc., which is specifically limited in embodiment of the present disclosure.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display module, comprising:
   a display panel;
   a conductive shielding layer, which is located on a side of the display panel;
   a protective layer, which is located between the display panel and the conductive shielding layer;
   a cover plate, which is located on a side of the display panel facing away from the conductive shielding layer; and
   a conductive film, which is located on a side of the cover plate facing the conductive shielding layer and is connected to the cover plate and the conductive shielding layer separately,
   wherein the conductive film comprises a first part, a second part and a third part, and wherein the first part is located on a side wall of the display panel, the second part is located on a side of the conductive shielding layer facing away from the cover plate, the third part is located on a side of the cover plate facing the display panel, and on a side of the second part facing away from the display panel.

2. The display module of claim 1, further comprising:
   a display area; and
   a non-display area disposed around the display area, wherein the conductive film is located in the non-display area,
   wherein the display panel comprises a main body and a rear folded portion, and the conductive film and the rear folded portion do not overlap in a direction perpendicular to a plane where the cover plate is located.

3. The display module of claim 2, wherein the conductive film is located on at least one side of the display area.

4. The display module of claim 3, comprising:
   a special-shaped area, wherein the conductive film at least partially overlaps the special-shaped area in the direction perpendicular to the plane where the cover plate is located.

5. The display module of claim 1, wherein the conductive film comprises a silver paste.

6. The display module of claim 1, wherein the conductive film comprises a fluorinating agent and conductive particles; and
   wherein the conductive particles comprise one or more of carbon powder, copper powder, aluminum powder and iron powder.

7. The display module of claim 1, further comprising:
   a first conductive layer, which is located on a side of the cover plate facing the conductive film and is connected to the cover plate and the conductive film separately,
   wherein in a direction perpendicular to a plane where the cover plate is located, an overlapping area of the first conductive layer and the cover plate is larger than an overlapping area of the first conductive layer and the conductive film.

8. The display module of claim 7, further comprising:
   a display area; and
   a non-display area disposed around the display area, wherein the first conductive layer is located in the non-display area.

9. The display module of claim 7, wherein the first conductive layer comprises a conductive ink layer or an indium tin oxide layer.

10. The display module of claim 1, further comprising:
    a first transparent conductive layer and a shielding layer which are sequentially disposed on the side of the cover plate facing the display panel; and
    a display area, and a non-display area disposed around the display area, wherein the shielding layer is located in the non-display area, and wherein in a direction perpendicular to a plane where the cover plate is located, the first transparent conductive layer at least partially overlaps the display area.

11. The display module of claim 10, wherein in the direction perpendicular to the plane where the cover plate is located, an overlapping area of the first transparent conductive layer and the cover plate is larger than an overlapping area of the conductive film and the cover plate.

12. The display module of claim 10, wherein the first transparent conductive layer comprises at least one of indium tin oxide, indium zinc oxide, indium tin zinc oxide, antimony tin oxide, aluminum zinc oxide, gallium zinc oxide, zinc oxide, or indium oxide.

13. The display module of claim 1, further comprising:
    a polarizer, which is located on a side of the display panel facing the cover plate;
    an optically clear adhesive layer, which is located at a side of the polarizer facing the cover plate; and
    a second conductive layer, which is located between the polarizer and the optically clear adhesive layer and is connected to the conductive film.

14. The display module of claim 1, further comprising:
    a third conductive layer, which is connected to the conductive film,
    wherein the third conductive layer is located between the display panel and the protective layer, and/or the third conductive layer is located between the protective layer and the conductive shielding layer.

15. A display device, comprising a display module, wherein the display module comprises:
    a display panel;
    a conductive shielding layer, which is located on a side of the display panel;
    a protective layer, which is located between the display panel and the conductive shielding layer;
    a cover plate, which is located on a side of the display panel facing away from the conductive shielding layer; and
    a conductive film, which is located on a side of the cover plate facing the conductive shielding layer and is connected to the cover plate and the conductive shielding layer separately,
    wherein the conductive film comprises a first part, a second part and a third part, and
    wherein the first part is located on a side wall of the display panel, the second part is located on a side of the conductive shielding layer facing away from the cover plate, the third part is located on a side of the cover plate facing the display panel, and on a side of the second part facing away from the display panel.

16. The display device of claim 15, further comprising:
a display area; and
a non-display area disposed around the display area, wherein the conductive film is located in the non-display area,
wherein the display panel comprises a main body and a rear folded portion, and the conductive film and the rear folded portion do not overlap in a direction perpendicular to a plane where the cover plate is located.

17. The display device of claim 16, wherein the conductive film is located on at least one side of the display area.

18. The display device of claim 17, comprising:
a special-shaped area, wherein the conductive film at least partially overlaps the special-shaped area in the direction perpendicular to the plane where the cover plate is located.

19. The display device of claim 15, wherein the conductive film comprises a silver paste.

20. The display device of claim 15, wherein
the conductive film comprises a fluorinating agent and conductive particles; and
the conductive particles comprise one or more of carbon powder, copper powder, aluminum powder and iron powder.

* * * * *